(12) United States Patent
Maejima et al.

(10) Patent No.: US 10,796,779 B2
(45) Date of Patent: *Oct. 6, 2020

(54) SEMICONDUCTOR MEMORY DEVICE

(71) Applicant: TOSHIBA MEMORY CORPORATION, Tokyo (JP)

(72) Inventors: Hiroshi Maejima, Setagaya Tokyo (JP); Noboru Shibata, Kawasaki Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/800,180

(22) Filed: Feb. 25, 2020

(65) Prior Publication Data
US 2020/0194088 A1 Jun. 18, 2020

Related U.S. Application Data

(63) Continuation of application No. 16/410,815, filed on May 13, 2019, now Pat. No. 10,614,900, which is a
(Continued)

(30) Foreign Application Priority Data

Feb. 12, 2016 (JP) ................. 2016-025096

(51) Int. Cl.
*G11C 11/34* (2006.01)
*G11C 16/34* (2006.01)
(Continued)

(52) U.S. Cl.
CPC ...... *G11C 16/3459* (2013.01); *G11C 11/5628* (2013.01); *G11C 16/0483* (2013.01);
(Continued)

(58) Field of Classification Search
CPC .. G11C 11/4097; G11C 11/4091; G11C 7/065
(Continued)

(56) References Cited

U.S. PATENT DOCUMENTS 7,929,344 B2   4/2011  Maejima
7,936,004 B2   5/2011  Kito et al.
(Continued)

FOREIGN PATENT DOCUMENTS

CN   101937714 A   1/2011
JP   2007-266143 A  10/2007

OTHER PUBLICATIONS

Office Action dated Mar. 21, 2018 in corresponding Taiwanese Patent Application No. 106129832 with English translation, 8 pages.
(Continued)

*Primary Examiner* — Hoai V Ho
*Assistant Examiner* — Minh Dinh
(74) *Attorney, Agent, or Firm* — Kim & Stewart LLP

(57) ABSTRACT

A semiconductor memory device includes a first memory cell which is capable of being set to any one of at least eight threshold voltages, a first bit line connected to the first memory cell, a word line connected to a gate of the first memory cell, a sense amplifier connected to the first bit line, wherein the sense amplifier has at least four data latch circuits, and an extra data latch circuit connected to the sense amplifier through a data bus. A verification operation for verifying the threshold voltage of the first memory cell is performed after a programming operation is performed on the first memory cell, and the verification operation includes seven verification operations during which the four data latch circuits, but not the extra data latch circuit, are accessed.

20 Claims, 20 Drawing Sheets

Related U.S. Application Data continuation of application No. 16/020,907, filed on Jun. 27, 2018, now Pat. No. 10,319,450, which is a continuation of application No. 15/405,098, filed on Jan. 12, 2017, now Pat. No. 10,037,813.

(51) Int. Cl.

| | |
|---|---|
| *G11C 16/26* | (2006.01) |
| *G11C 16/10* | (2006.01) |
| *G11C 16/24* | (2006.01) |
| *G11C 16/08* | (2006.01) |
| *G11C 11/56* | (2006.01) |
| *G11C 16/04* | (2006.01) |

(52) U.S. Cl.
 CPC .............. *G11C 16/08* (2013.01); *G11C 16/10* (2013.01); *G11C 16/24* (2013.01); *G11C 16/26* (2013.01); *G11C 2211/5621* (2013.01)

(58) Field of Classification Search
 USPC ........................................ 365/185.22, 185.21
 See application file for complete search history.

(56) References Cited

U.S. PATENT DOCUMENTS

| | | |
|---|---|---|
| 8,339,857 B2 | 12/2012 | Edahiro |
| 8,917,557 B2 | 12/2014 | Sakaguchi et al. |
| 9,117,549 B1 | 8/2015 | Yoo et al. |
| 9,672,926 B2 | 6/2017 | Shiino et al. |
| 9,941,013 B2 | 4/2018 | Maejima |
| 9,984,761 B2 | 5/2018 | Maejima et al. |
| 10,037,813 B2 | 7/2018 | Maejima et al. |
| 10,319,450 B2 | 6/2019 | Maejima et al. |
| 2008/0117684 A1 | 5/2008 | Hemink |
| 2010/0329031 A1 | 12/2010 | Lee |
| 2011/0122702 A1 | 5/2011 | Li |
| 2012/0069674 A1 | 3/2012 | Lee |
| 2013/0033937 A1 | 2/2013 | Aritome et al. |
| 2014/0340964 A1 | 11/2014 | Shiino et al. |
| 2015/0370481 A1 | 12/2015 | Ahn |
| 2016/0019948 A1 | 1/2016 | Pang et al. |
| 2016/0307638 A1 | 10/2016 | Shirakawa et al. |
| 2017/0076788 A1 | 3/2017 | Nakano et al. |
| 2019/0267108 A1* | 8/2019 | Maejima .............. G11C 11/5628 |

OTHER PUBLICATIONS

Taiwan Office Action dated Apr. 19, 2017 in related Taiwan Patent Application 105121270 with English Translation.

First Office Action dated Feb. 3, 2020 in corresponding Chinese Patent Application No. 201610585571.5 with machine English translation, 23 pages.

\* cited by examiner

FIG. 7

(a) BDL=1, CDL=1

| step | operation | BDL | CDL | SEN | LBUS | SDL |
|---|---|---|---|---|---|---|
| 0 | SEN=1(pre-charge) | 1 | 1 | 1 | – | – |
| 1 | BDL → LBUS | 1 | 1 | 1 | 1 | – |
| 2 | LBUS → /SEN | 1 | 1 | 0 | 1 | – |
| 3 | CDL → LBUS | 1 | 1 | 0 | 1 | – |
| 4 | CDL drive stop | 1 | 1 | 0 | 1 | – |
| 5 | SEN=0 → LBUS no change | 1 | 1 | 0 | 1 | – |
| 6 | LBUS → SDL | 1 | 1 | 0 | 1 | 1 |

(b) BDL=1, CDL=0

| step | operation | BDL | CDL | SEN | LBUS | SDL |
|---|---|---|---|---|---|---|
| 0 | SEN=1(pre-charge) | 1 | 0 | 1 | – | – |
| 1 | BDL → LBUS | 1 | 0 | 1 | 1 | – |
| 2 | LBUS → /SEN | 1 | 0 | 0 | 1 | – |
| 3 | CDL → LBUS | 1 | 0 | 0 | 0 | – |
| 4 | CDL drive stop | 1 | 0 | 0 | 0 | – |
| 5 | SEN=0 → LBUS no change | 1 | 0 | 0 | 0 | – |
| 6 | LBUS → SDL | 1 | 0 | 0 | 0 | 0 |

(c) BDL=0, CDL=1

| step | operation | BDL | CDL | SEN | LBUS | SDL |
|---|---|---|---|---|---|---|
| 0 | SEN=1(pre-charge) | 0 | 1 | 1 | – | – |
| 1 | BDL → LBUS | 0 | 1 | 1 | 0 | – |
| 2 | LBUS → /SEN | 0 | 1 | 1 | 0 | – |
| 3 | CDL → LBUS | 0 | 1 | 1 | 1 | – |
| 4 | CDL drive stop | 0 | 1 | 1 | 1 | – |
| 5 | SEN=1 → LBUS=0 | 0 | 1 | 1 | 0 | – |
| 6 | LBUS → SDL | 0 | 1 | 1 | 0 | 0 |

(d) BDL=0, CDL=0

| step | operation | BDL | CDL | SEN | LBUS | SDL |
|---|---|---|---|---|---|---|
| 0 | SEN=1(pre-charge) | 0 | 0 | 1 | – | – |
| 1 | BDL → LBUS | 0 | 0 | 1 | 0 | – |
| 2 | LBUS → /SEN | 0 | 0 | 1 | 0 | – |
| 3 | CDL → LBUS | 0 | 0 | 1 | 0 | – |
| 4 | CDL drive stop | 0 | 0 | 1 | 0 | – |
| 5 | SEN=1 → LBUS=0 | 0 | 0 | 1 | 0 | – |
| 6 | LBUS → SDL | 0 | 0 | 1 | 0 | 0 |

FIG. 8

(a) BDL=1, CDL=1

| step | operation | BDL | CDL | SEN | LBUS | SDL |
|---|---|---|---|---|---|---|
| 0 | SEN=1(pre-charge) | 1 | 1 | 1 | – | – |
| 1 | BDL → /LBUS | 1 | 1 | 1 | 0 | – |
| 2 | LBUS → /SEN | 1 | 1 | 1 | 0 | – |
| 3 | CDL → /LBUS | 1 | 1 | 1 | 0 | – |
| 4 | CDL drive stop | 1 | 1 | 1 | 0 | – |
| 5 | SEN=1 → LBUS=0 | 1 | 1 | 1 | 0 | – |
| 6 | LBUS → /SDL | 1 | 1 | 1 | 0 | 1 |

(b) BDL=1, CDL=0

| step | operation | BDL | CDL | SEN | LBUS | SDL |
|---|---|---|---|---|---|---|
| 0 | SEN=1(pre-charge) | 1 | 0 | 1 | – | – |
| 1 | BDL → /LBUS | 1 | 0 | 1 | 0 | – |
| 2 | LBUS → /SEN | 1 | 0 | 1 | 0 | – |
| 3 | CDL → /LBUS | 1 | 0 | 1 | 1 | – |
| 4 | CDL drive stop | 1 | 0 | 1 | 1 | – |
| 5 | SEN=1 → LBUS=0 | 1 | 0 | 1 | 0 | – |
| 6 | LBUS → /SDL | 1 | 0 | 0 | 0 | 1 |

(c) BDL=0, CDL=1

| step | operation | BDL | CDL | SEN | LBUS | SDL |
|---|---|---|---|---|---|---|
| 0 | SEN=1(pre-charge) | 0 | 1 | 1 | – | – |
| 1 | BDL → /LBUS | 0 | 1 | 1 | 1 | – |
| 2 | LBUS → /SEN | 0 | 1 | 0 | 1 | – |
| 3 | CDL → /LBUS | 0 | 1 | 0 | 0 | – |
| 4 | CDL drive stop | 0 | 1 | 0 | 0 | – |
| 5 | SEN=0 → LBUS no change | 0 | 1 | 0 | 0 | – |
| 6 | LBUS → /SDL | 0 | 1 | 0 | 0 | 1 |

(d) BDL=0, CDL=0

| step | operation | BDL | CDL | SEN | LBUS | SDL |
|---|---|---|---|---|---|---|
| 0 | SEN=1(pre-charge) | 0 | 0 | 1 | – | – |
| 1 | BDL → /LBUS | 0 | 0 | 1 | 1 | – |
| 2 | LBUS → /SEN | 0 | 0 | 0 | 1 | – |
| 3 | CDL → /LBUS | 0 | 0 | 0 | 1 | – |
| 4 | CDL drive stop | 0 | 0 | 0 | 1 | – |
| 5 | SEN=0 → LBUS no change | 0 | 0 | 0 | 1 | – |
| 6 | LBUS → /SDL | 0 | 0 | 0 | 1 | 0 |

FIG. 11

| Latch | Verify | LOGICAL ARITHMETIC EXPRESSION | "Er" | "A" | "B" | "C" | "D" | "E" | "F" | "G" | |
|---|---|---|---|---|---|---|---|---|---|---|---|
| XDL | | | 1 | 1 | 1 | 1 | 0 | 0 | 0 | 0 | Lower |
| ADL | | | 1 | 0 | 0 | 0 | 0 | 0 | 0 | 0 | P/F INFORMATION IS HELD |
| BDL | | | 1 | 1 | 0 | 0 | 0 | 0 | 0 | 1 | Middle |
| CDL | | | 1 | 0 | 1 | 0 | 1 | 0 | 1 | 1 | Upper |
| SDL | "A","F" | /(BDL×(/CDL)) | 1 | 0 | 1 | 1 | 1 | 1 | 0 | 1 | |
| SDL | "B","E" | /((/BDL)×CDL) | 1 | 1 | 0 | 1 | 1 | 0 | 1 | 1 | |
| SDL | "C","D" | /((/BDL)×(/CDL)) | 1 | 1 | 1 | 0 | 0 | 1 | 1 | 1 | |
| SDL | "Er","G" | /(BDL×CDL) | 0 | 1 | 1 | 1 | 1 | 1 | 1 | 0 | |

FIG. 13

| VERIFICATION TARGET LEVEL \ THE NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL (VfyA) | ○ | ○ | ○ | ○ | ○ | ○ | | | | | | | | | | | | | |
| "B" LEVEL (VfyB) | | ○ | ○ | ○ | ○ | ○ | ○ | ○ | | | | | | | | | | | |
| "C" LEVEL (VfyC) | | | | ○ | ○ | ○ | ○ | ○ | ○ | ○ | | | | | | | | | |
| "D" LEVEL (VfyD) | | | | | | ○ | ○ | ○ | ○ | ○ | ○ | ○ | | | | | | | |
| "E" LEVEL (VfyE) | | | | | | | | | ○ | ○ | ○ | ○ | ○ | ○ | | | | | |
| "F" LEVEL (VfyF) | | | | | | | | | | | ○ | ○ | ○ | ○ | ○ | ○ | | | |
| "G" LEVEL (VfyG) | | | | | | | | | | | | | ○ | ○ | ○ | ○ | ○ | ○ | ○ |

FIG. 14

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | 0 | 0 | 0/1 | 0/1 | 0/1 | 0/1 | 0/1 | 0/1 | 1 | 1 | 1 | 1 | 1 | 1 | 1 | 1 | 1 | 1 | 1 |
| "C" LEVEL | 0 | 0 | 0 | 0 | 0/1 | 0/1 | 0/1 | 0/1 | 0/1 | 0/1 | 1 | 1 | 1 | 1 | 1 | 1 | 1 | 1 | 1 |
| "D" LEVEL | 0 | 0 | 0 | 0 | 0 | 0 | 0/1 | 0/1 | 0/1 | 0/1 | 0/1 | 0/1 | 1 | 1 | 1 | 1 | 1 | 1 | 1 |
| "E" LEVEL | 0 | 0 | 0 | 0 | 0 | 0 | 0 | 0 | 0/1 | 0/1 | 0/1 | 0/1 | 0/1 | 0/1 | 1 | 1 | 1 | 1 | 1 |
| "F" LEVEL | 0 | 0 | 0 | 0 | 0 | 0 | 0 | 0 | 0 | 0/1 | 0/1 | 0/1 | 0/1 | 0/1 | 0/1 | 0/1 | 1 | 1 | 1 |
| "G" LEVEL | 0 | 0 | 0 | 0 | 0 | 0 | 0 | 0 | 0 | 0 | 0 | 0/1 | 0/1 | 0/1 | 0/1 | 0/1 | 0/1 | 0/1 | 0/1 |

(a) INPUT DATA TO ADL, BDL, AND CDL

| Latch | "Er" | "A" | "B" | "C" | "D" | "E" | "F" | "G" | |
|---|---|---|---|---|---|---|---|---|---|
| XDL | 1 | 1 | 1 | 1 | 0 | 0 | 0 | 0 | Lower |
| ADL | 1 | 0 | 0 | 0 | 0 | 0 | 0 | 0 | P/F INFORMATION IS HELD |
| BDL | 1 | 1 | 0 | 0 | 0 | 0 | 1 | 1 | Middle |
| CDL | 1 | 0 | 1 | 0 | 0 | 1 | 0 | 1 | Upper |
| SDL | - | - | - | - | - | - | - | - | |

SDL=/ADL (b) INPUT FIRST PROGRAMMING DATA TO SDL

| Latch | "Er" | "A" | "B" | "C" | "D" | "E" | "F" | "G" | |
|---|---|---|---|---|---|---|---|---|---|
| XDL | 1 | 1 | 1 | 1 | 0 | 0 | 0 | 0 | Lower |
| ADL | 1 | 0 | 0 | 0 | 0 | 0 | 0 | 0 | P/F INFORMATION IS HELD |
| BDL | 1 | 1 | 0 | 0 | 0 | 0 | 1 | 1 | Middle |
| CDL | 1 | 0 | 1 | 0 | 0 | 1 | 0 | 1 | Upper |
| SDL | 0 | 1 | 1 | 1 | 1 | 1 | 1 | 1 | Program data |

"1"Program    "0"Program

FIG. 18

⇩ ADL=ADL+(/SDL)

(e) UPDATE ADL

| Latch | "Er" | "A" | "B" | "C" | "D" | "E" | "F" | "G" | |
|---|---|---|---|---|---|---|---|---|---|
| XDL | 1 | 1 | 1 | 1 | 0 | 0 | 0 | 0 | Lower |
| ADL | 1 | 1/0 | 0 | 0 | 0 | 0 | 0 | 0 | P/F INFORMATION IS HELD |
| BDL | 1 | 1 | 0 | 0 | 0 | 0 | 1 | 1 | Middle |
| CDL | 1 | 0 | 1 | 0 | 0 | 1 | 0 | 1 | Upper |
| SDL | 1 | 0/1 | 1 | 1 | 1 | 1 | 1 | 1 | Sense data |

⇩ SDL=/ADL (f) INPUT SECOND PROGRAMMING DATA TO SDL

| Latch | "Er" | "A" | "B" | "C" | "D" | "E" | "F" | "G" | |
|---|---|---|---|---|---|---|---|---|---|
| XDL | 1 | 1 | 1 | 1 | 0 | 0 | 0 | 0 | Lower |
| ADL | 1 | 1/0 | 0 | 0 | 0 | 0 | 0 | 0 | P/F INFORMATION IS HELD |
| BDL | 1 | 1 | 0 | 0 | 0 | 0 | 1 | 1 | Middle |
| CDL | 1 | 0 | 1 | 0 | 0 | 1 | 0 | 1 | Upper |
| SDL | 0 | 0/1 | 1 | 1 | 1 | 1 | 1 | 1 | Program data |

FIG. 19

| Latch | Verify | LOGICAL ARITHMETIC EXPRESSION | "Er" | "A" | "B" | "C" | "D" | "E" | "F" | "G" |
|---|---|---|---|---|---|---|---|---|---|---|
| XDL | | | 1 | 1 | 1 | 1 | 0 | 0 | 0 | 0 |
| ADL | | | - | - | - | - | - | - | - | - |
| BDL | | | 1 | 1 | 0 | 0 | 0 | 1 | 1 | 1 |
| CDL | | | 1 | 0 | 0 | 0 | 0 | 1 | 0 | 1 |
| SDL | "A" | /((/ADL)×BDL×(/CDL)) | 1 | 0/1 | 1 | 1 | 1 | 1 | 1 | 1 |
| | "B" | /((/ADL)×(/BDL)×(/CDL)) | 1 | 1 | 0/1 | 1 | 1 | 1 | 1 | 1 |
| | "C" | /((/ADL)×(/BDL)×(/CDL)) | 1 | 1 | 1 | 0/1 | 1 | 1 | 1 | 1 |
| | "D" | /((/ADL)×(/BDL)×(/CDL)) | 1 | 1 | 1 | 1 | 0/1 | 1 | 1 | 1 |
| | "E" | /((/ADL)×BDL×(/CDL)) | 1 | 1 | 1 | 1 | 1 | 0/1 | 1 | 1 |
| | "F" | /((/ADL)×BDL×(/CDL)) | 1 | 1 | 1 | 1 | 1 | 1 | 0/1 | 1 |
| | "G" | /((/ADL)×BDL×CDL) | 1 | 1 | 1 | 1 | 1 | 1 | 1 | 0/1 |

Lower / P/E INFORMATION IS HELD / Middle / Upper

SEMICONDUCTOR MEMORY DEVICE

CROSS-REFERENCE TO RELATED APPLICATION

This application is a continuation of U.S. patent application Ser. No. 16/410,815, filed May 13, 2019, which is a continuation of U.S. patent application Ser. No. 16/020,907, filed Jun. 27, 2018, now U.S. Pat. No. 10,319,450, issued Jun. 11, 2019, which is a continuation of U.S. patent application Ser. No. 15/405,098, filed Jan. 12, 2017, now U.S. Pat. No. 10,037,813, issued Jul. 31, 2018, which is based upon and claims the benefit of priority from Japanese Patent Application No. 2016-025096, filed Feb. 12, 2016, the entire contents of each of the foregoing are incorporated herein by reference.

FIELD

Embodiments described herein relate generally to a semiconductor memory device.

BACKGROUND

NAND-type flash memories are known as semiconductor memory devices.

DESCRIPTION OF THE DRAWINGS

FIG. 7 is a flow diagram showing an AND operation in the sense amplifier unit included in the semiconductor memory device according to the first embodiment.

FIG. 8 is a flow diagram showing an OR operation in the sense amplifier unit included in the semiconductor memory device according to the first embodiment.

FIG. 11 is a diagram showing data held in a latch circuit in a verification operation of the semiconductor memory device according to the first embodiment.

FIG. 13 is a diagram showing a relationship between the number of loops and a verification operation in a writing operation of the semiconductor memory device according to the first embodiment.

FIG. 14 is a diagram showing a relationship between the number of loops and a bit line voltage in a writing operation of the semiconductor memory device according to the first embodiment.

FIG. 18 is a diagram showing data held in a latch circuit in a writing operation of the semiconductor memory device according to the first embodiment.

FIG. 19 is a diagram showing data held in a latch circuit in a verification operation of a semiconductor memory device according to a second embodiment.

DETAILED DESCRIPTION

Figure 1:
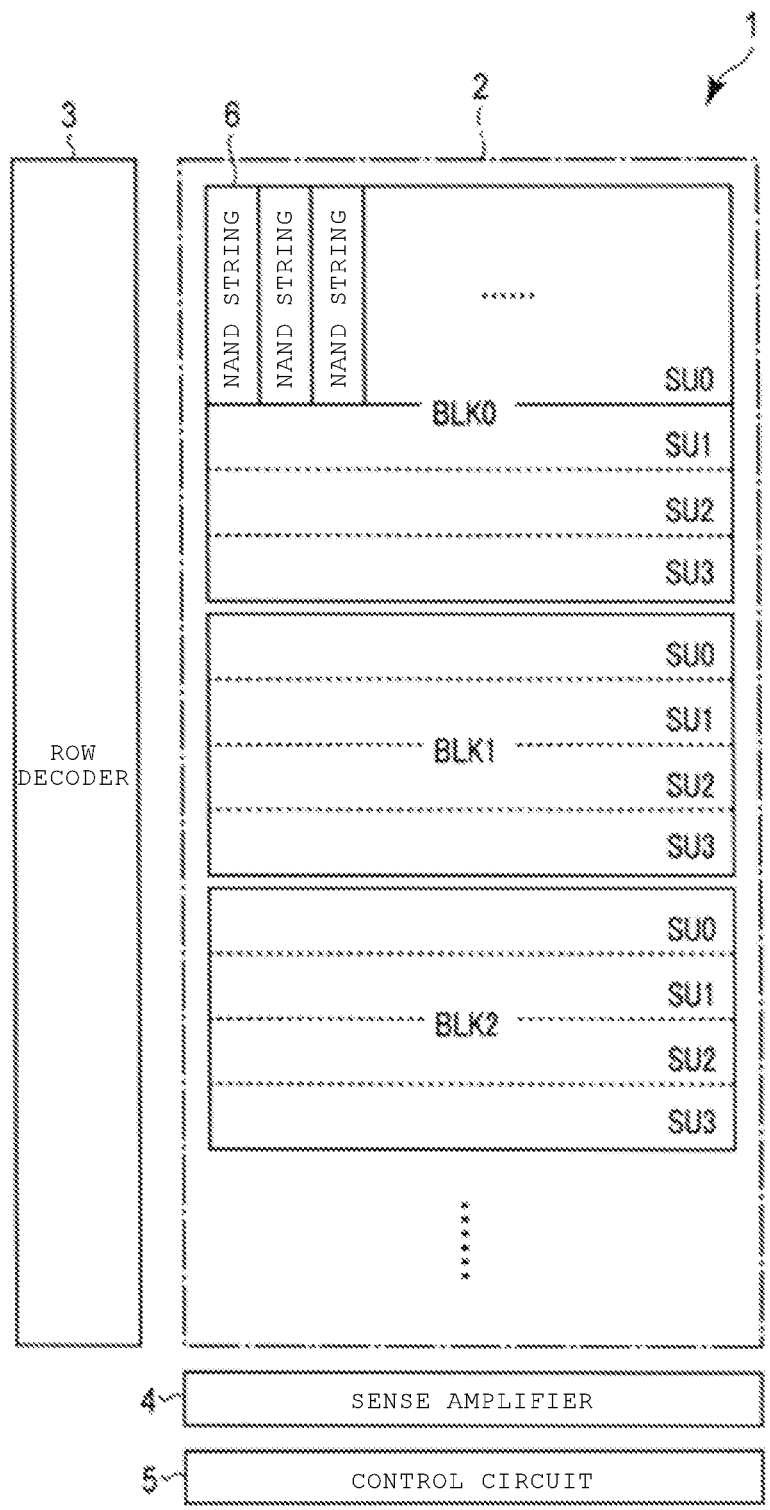
FIG. 1 is a block diagram of a semiconductor memory device according to a first embodiment.

A semiconductor memory device capable of improving processing capability is provided.

In general, according to an embodiment, a semiconductor memory device includes a first memory cell which is capable of being set to any one of at least eight threshold voltages, a first bit line connected to the first memory cell, a word line connected to a gate of the first memory cell and a sense amplifier connected to the first bit line. A verification operation for verifying the threshold voltage of the first memory cell is performed after a programming operation is performed on the first memory cell, and the verification operation includes seven verification operations including a first verification operation in which a first voltage is applied to the word line, a second verification operation in which a second voltage higher than the first voltage is applied to the word line, a third verification operation in which a third voltage higher than the second voltage is applied to the word line, a fourth verification operation in which a fourth voltage higher than the third voltage is applied to the word line, a fifth verification operation in which a fifth voltage higher than the fourth voltage is applied to the word line, a sixth verification operation in which a sixth voltage higher than the fifth voltage is applied to the word line, and a seventh verification operation in which a seventh voltage higher than the sixth voltage is applied to the word line. The sense amplifier applies a charging voltage to the first bit line during two of the seven verification operations, and does not apply the charging voltage to the first bit line during the remaining five of the seven verification operations.

It is possible to provide a semiconductor memory device capable of improving processing capability through the embodiments described below. Meanwhile, the embodiments are not limited to the configurations described below, and can be modified in various ways.

Hereinafter, embodiments will be described with reference to the accompanying drawings. In the description, common portions are denoted by common reference numerals and signs throughout the drawings.

1. First Embodiment

A semiconductor memory device according to a first embodiment will be described below. Hereinafter, as an example of the semiconductor memory device, a three-dimensional stacked NAND-type flash memory in which a memory cell transistor is three-dimensionally stacked on a semiconductor substrate will be described.

1.1 Configuration 1.1.1 Overall Configuration of Semiconductor Memory Device

First, the overall configuration of a semiconductor memory device according to this embodiment will be described with reference to FIG. 1. FIG. 1 is a block diagram of a NAND-type flash memory according to this embodiment.

As shown in the drawing, a NAND-type flash memory 1 includes a memory cell array 2, a row decoder 3, a sense amplifier 4, and a control circuit 5.

The memory cell array 2 includes a plurality of blocks BLK (BLK0, BLK1, BLK2, ...) including nonvolatile memory cell transistors arranged in a matrix configuration. Each of the blocks BLK includes, for example, four string units SU (SU0 to SU3). In addition, each of the string units SU includes a plurality of NAND strings 6. The number of blocks in the memory cell array 2 and the number of string units in the block are arbitrary. The memory cell array 2 will be described later in detail.

The row decoder 3 decodes a row address, selects one of the blocks BLK on the basis of a result of the decoding, and selects one of the string units SU. In addition, a necessary voltage is output to the block BLK. The row address is output from a controller that controls, for example, the NAND-type flash memory 1.

The sense amplifier 4 senses data which is read out from the memory cell array 2 during a data read-out operation. In addition, the read-out data is output to the controller. Write data received from an external controller is transmitted to the memory cell array 2 during a data writing operation.

The control circuit 5 controls the operation of the entire NAND-type flash memory 1.

1.1.2 Configuration of Block BLK

Figure 2:
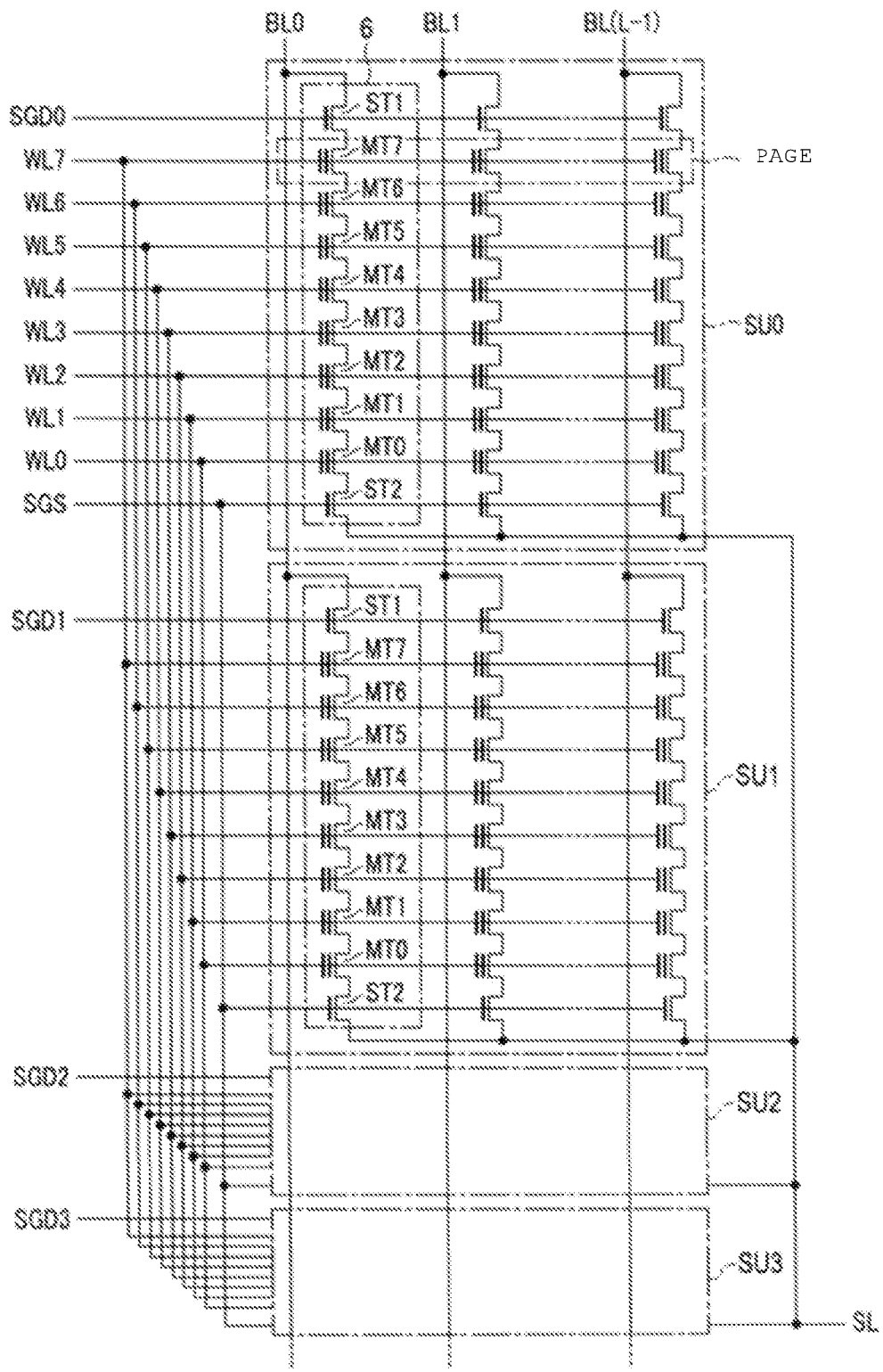
FIG. 2 is a circuit diagram of a memory cell array included in the semiconductor memory device according to the first embodiment.

Next, a configuration of the above-mentioned block BLK will be described with reference to FIG. 2. As described above, the block BLK includes, for example, four string units SU, and each of the string units SU includes a plurality of NAND strings 6.

As shown in the drawing, each of the NAND strings 6 includes, for example, eight memory cell transistors MT (MT0 to MT7) and selection transistors ST1 and ST2. The memory cell transistor MT includes a control gate and a charge storage layer, and holds data in a nonvolatile manner. In addition, the memory cell transistors MT are connected to each other in series between a source of the selection transistor ST1 and a drain of the selection transistor ST2.

A gate of each selection transistor ST1 in the string units SU0 to SU3 is connected to a respective one of select-gate lines SGD0 to SGD3. On the other hand, gates of the selection transistors ST2 in the string units SU0 to SU3 are connected to, for example, a select-gate line SGS in common. Alternatively, the string units may be connected to different sets of select-gate lines SGS0 to SGS3. In addition, control gates of the memory cell transistors MT0 to MT7 within the same block BLK are connected to word lines WL0 to WL7, respectively.

In addition, drains of the selection transistors ST1 of the NAND strings 6 in the string unit SU are connected to different bit lines BL (BL0 to BL(L−1), where L is a natural number of 2 or greater). In addition, the bit line BL is connected in common to one NAND string 6 within each of the string units SU across the plurality of blocks BLK. Further, sources of the plurality of selection transistors ST2 are connected to a source line SL in common.

In other words, the string unit SU is an integrated product of the NAND strings 6 that are connected to different bit lines BL and are connected to the same select-gate line SGD. In addition, the block BLK is an integrated product of the plurality of string units SU sharing the word lines WL. In addition, the memory cell array 2 is an integrated product of the plurality of blocks BLK sharing the bit lines BL.

Figure 3:
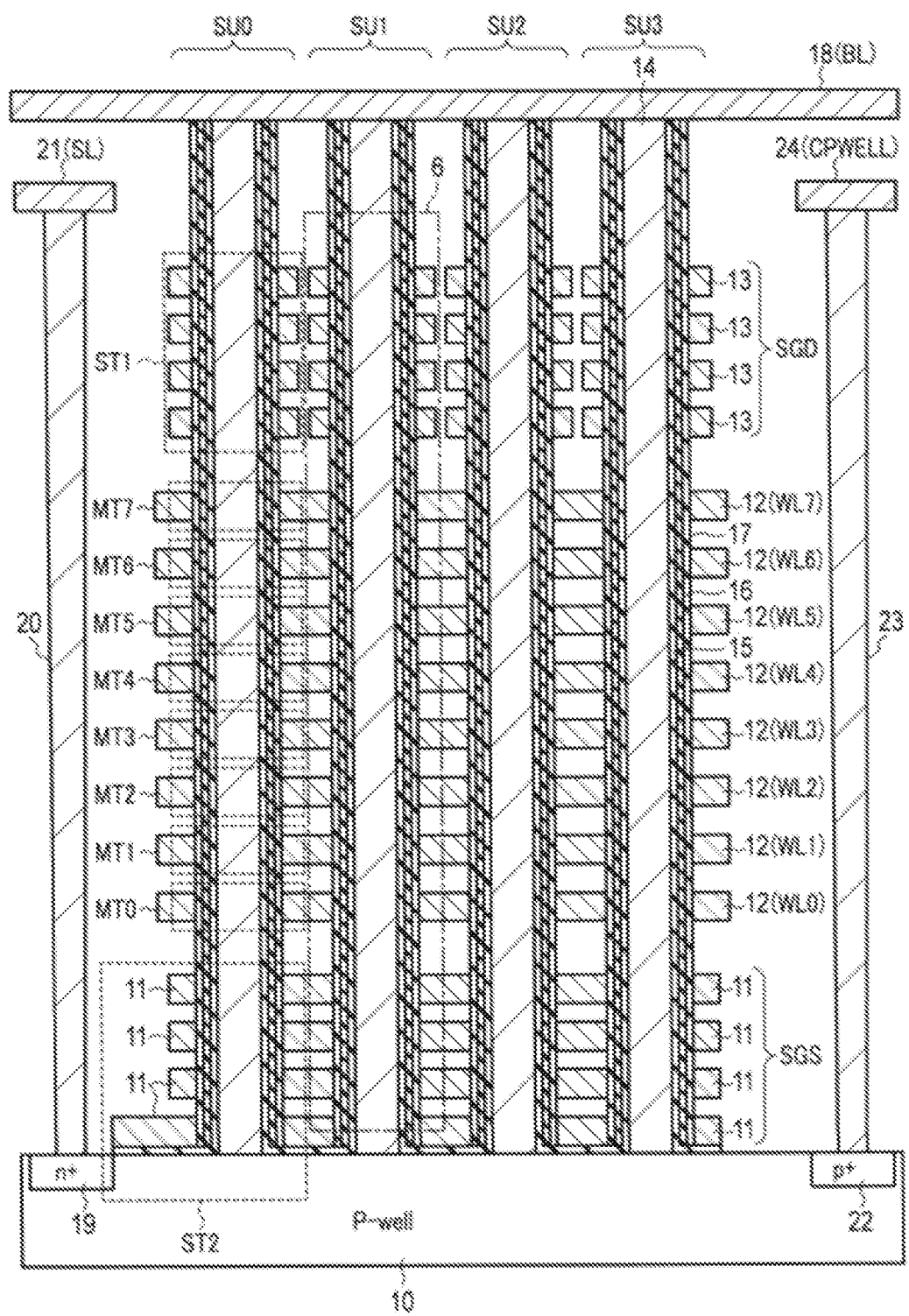
FIG. 3 is a cross-sectional diagram of the memory cell array included in the semiconductor memory device according to the first embodiment.

FIG. 3 is a cross-sectional diagram of a partial region of the block BLK. As shown in the drawing, the plurality of NAND strings 6 are formed on a p-type well region 10. That is, for example, four wiring layers 11 functioning as the select-gate line SGS, eight wiring layers 12 functioning as the word lines WL0 to WL7, and, for example, four wiring layers 13 functioning as the select-gate line SGD are sequentially stacked on the well region 10. An insulating film not shown in the drawing is formed between the stacked wiring layers.

In addition, a pillar-shaped conductor 14 passing through wiring layers 13, 12, and 11 and reaching the well region 10 is formed. A gate insulating film 15, a charge storage layer (an insulating film or a conductive film) 16, and a block insulating film 17 are sequentially formed on a side surface of the conductor 14, and the memory cell transistors MT and the selection transistors ST1 and ST2 are formed by these sequentially formed films. The conductor 14 functions as a current path of the NAND string 6, and serves as a region in which a channel of each transistor is formed. In addition, an upper end of the conductor 14 is connected to a metal wiring layer 18 functioning as the bit line BL.

An n+ type impurity diffusion layer 19 is formed in the surface region of the well region 10. A contact plug 20 is formed on the diffusion layer 19, and the contact plug 20 is connected to a metal wiring layer 21 functioning as a source line SL. Further, a p+ type impurity diffusion layer 22 is formed in the surface region of the well region 10. A contact plug 23 is formed on the diffusion layer 22, and the contact plug 23 is connected to a metal wiring layer 24 functioning as a well wiring CPWELL. The well wiring CPWELL is a wiring for applying a potential to the conductor 14 through the well region 10.

A plurality of configurations described above are arrayed in a depth direction of the sheet of FIG. 3, and the string unit SU is formed by a set of plurality of NAND strings 6 arranged in the depth direction.

Meanwhile, the erasing of data can be performed in units of the blocks BLK or in units smaller than the blocks BLK. An erasure method is disclosed in, for example, U.S. patent application Ser. No. 13/235,389, filed on Sep. 18, 2011, which is entitled "NONVOLATILE SEMICONDUCTOR MEMORY DEVICE," US patent application Ser. No. 12/694,690, filed on Jan. 27, 2010, which is entitled "NONVOLATILE SEMICONDUCTOR STORAGE DEVICE," and U.S. patent application Ser. No. 13/483,610, filed on May 30, 2012, which is entitled "NONVOLATILE SEMICONDUCTOR MEMORY DEVICE AND DATA ERASE METHOD THEREOF." All of these patent applications are incorporated by reference herein in their entireties.

Further, the memory cell array 2 may have any other configuration, such as the ones disclosed in U.S. patent application Ser. No. 12/407,403, filed on Mar. 19, 2009, which is entitled "THREE-DIMENSIONAL LAMINATED NONVOLATILE SEMICONDUCTOR MEMORY," U.S. patent application Ser. No. 12/406,524, filed on Mar. 18, 2009, which is entitled "THREE-DIMENSIONAL STACKED NONVOLATILE SEMICONDUCTOR MEMORY," U.S. patent application Ser. No. 12/679,991, filed on Mar. 25, 2010, which is entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, which is entitled "SEMICONDUCTOR MEMORY AND METHOD FOR MANUFACTURING SAME." All of these patent applications are incorporated by reference herein in their entireties.

1.1.3 Configuration of Sense Amplifier

Figure 4:
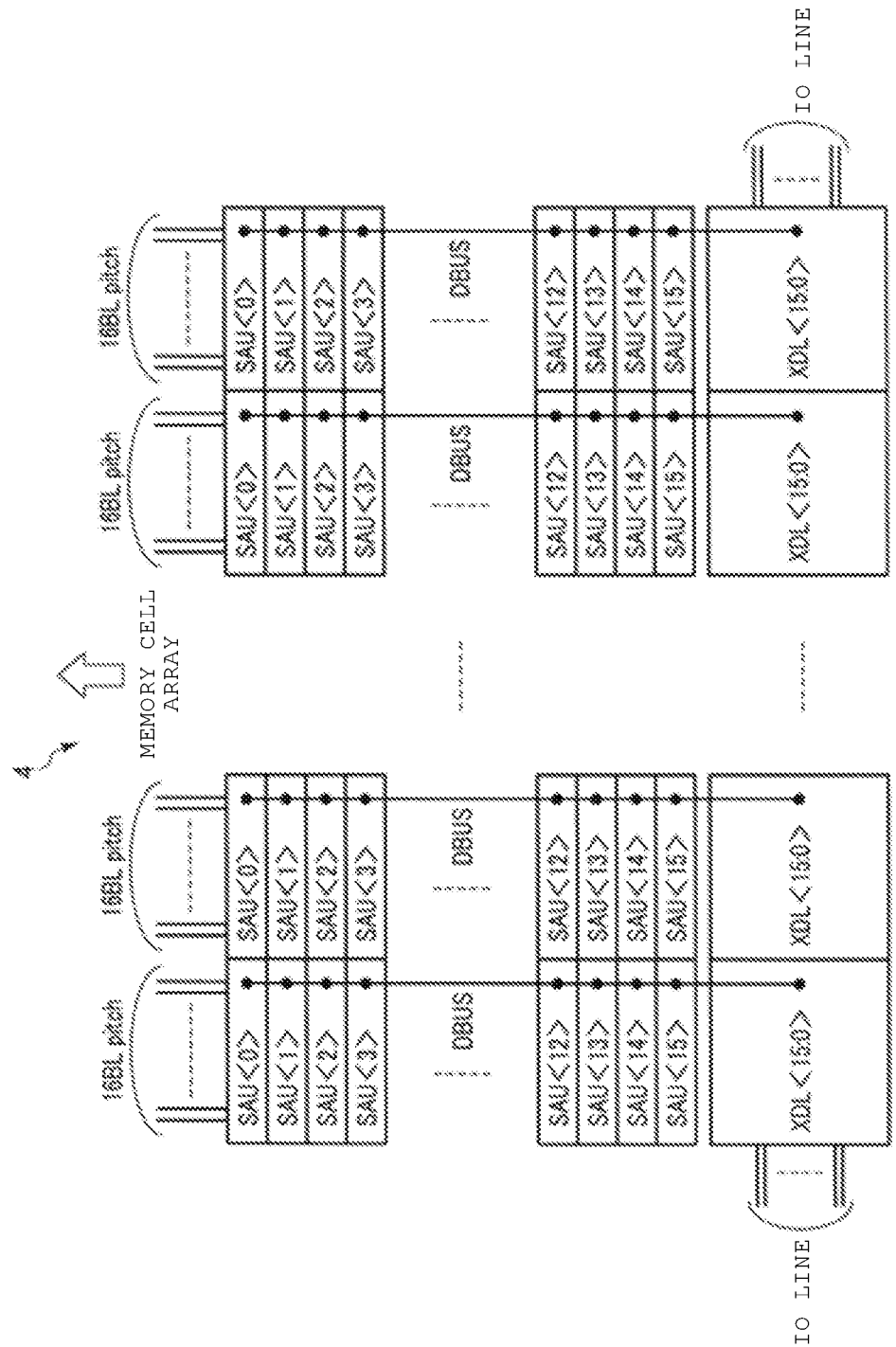
FIG. 4 is a block diagram of a sense amplifier included in the semiconductor memory device according to the first embodiment.

Next, a configuration of the sense amplifier 4 will be described with reference to FIG. 4.

As shown in the drawing, the sense amplifier 4 includes a plurality of sense amplifier units SAU and a plurality of latch circuits XDL.

For example, the sense amplifier unit SAU is provided for each bit line BL, senses data which is read out to the corresponding bit line BL, and transmits write data to the corresponding bit line BL. For example, sixteen sense amplifier units SAU are connected to one bus DBUS in common. Meanwhile, the number of sense amplifier units SAU connected to one bus DBUS is arbitrary. In the following description, the sixteen sense amplifier units SAU connected to one bus DBUS in common are distinguished from each other by being referred to as SAU<0> to SAU<15>, respectively.

The latch circuit XDL is provided for each sense amplifier unit SAU, and temporarily holds data related to the corresponding bit line BL. Sixteen latch circuits XDL<15:0> respectively corresponding to the sense amplifier units SAU<15> to SAU<0> are connected to one bus DBUS in common. In addition, each of the latch circuits XDL is connected to a data line IO. The latch circuit XDL is used to transmit and receive data between the sense amplifier unit SAU and the outside through the bus DBUS and the data line IO. That is, for example, data received from an external controller or the like is first held in the latch circuit XDL through the data line IO, and is then transmitted to the sense amplifier unit through the bus DBUS.

1.1.4 Configuration of Sense Amplifier Unit

Next, a configuration of the sense amplifier unit SAU will be described with reference to FIG. 5. In this embodiment, a current sensing type sense amplifier unit SAU that senses a current flowing through a bit line BL is described as an example, but a voltage sensing type sense amplifier unit SAU may be used.

Figure 5:
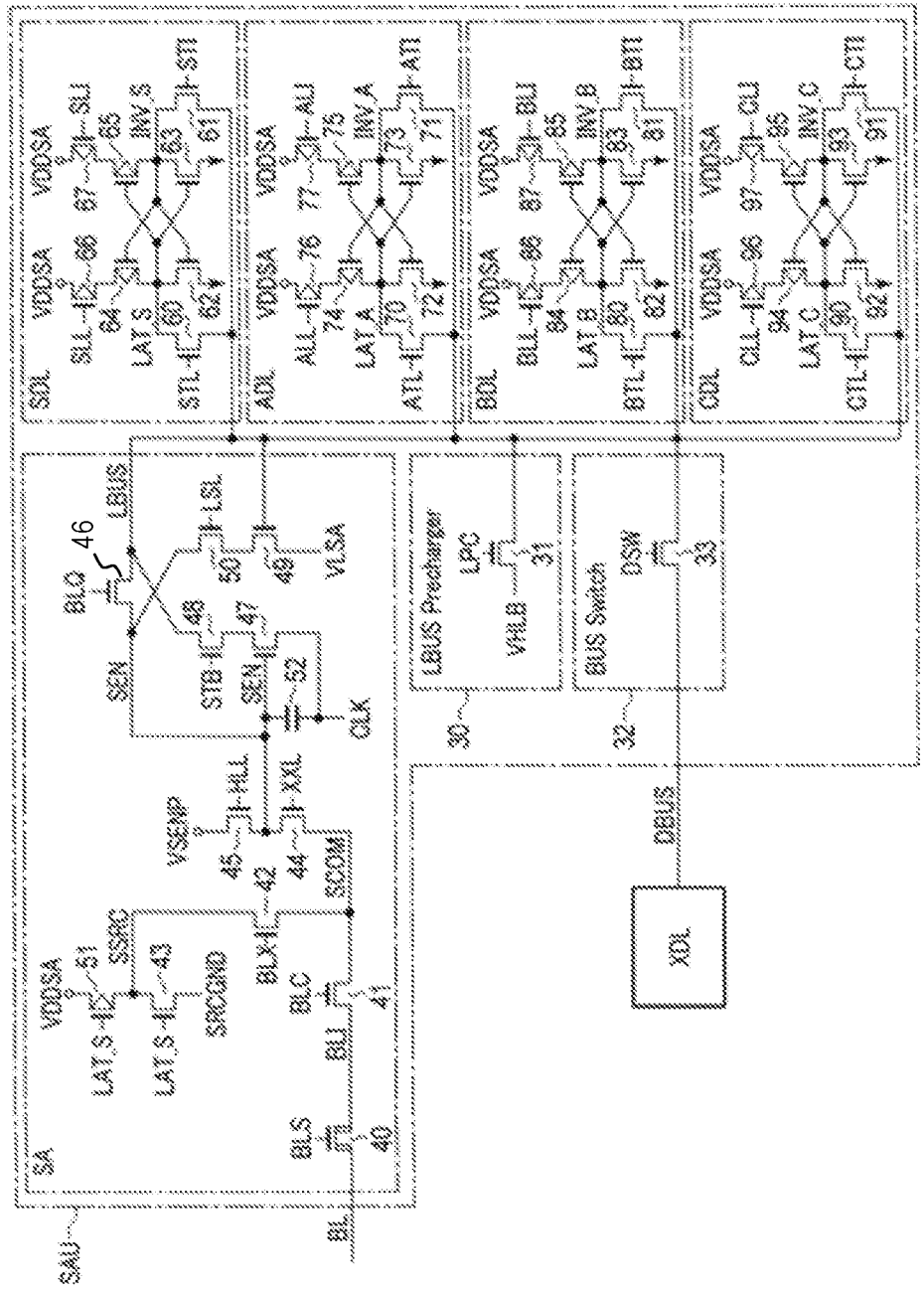
FIG. 5 is a circuit diagram of a sense amplifier unit included in the semiconductor memory device according to the first embodiment.

As shown in FIG. 5, the sense amplifier unit SAU includes a sense amplifier section SA, four latch circuits (SDL, ADL, BDL, and CDL), a precharge circuit 30, and a bus switch 32.

The sense amplifier section SA senses data which is read out to the bit line BL, and applies a voltage to the bit line BL in accordance with programming data. That is, the sense amplifier section SA is a module that directly controls the bit line BL. Further, the sense amplifier section is a module that performs an AND operation or an OR operation using data within the latch circuits SDL, ADL, BDL, and CDL.

Next, a circuit of the sense amplifier section SA will be described in detail. In the following description, one of a source and a drain of a transistor is referred to as "one end of a current path," and the other of the source and the drain is referred to as "the other end of a current path."

As shown in the drawing, the sense amplifier section SA includes a high breakdown voltage n-channel MOS transistor 40, low breakdown voltage n-channel MOS transistors 41 to 50, a low breakdown voltage p-channel MOS transistor 51, and a capacitor element 52.

In the transistor 40, a signal BLS is input to a gate, one end of a current path is connected to the corresponding bit line BL, and the other end of the current path is connected to a node BLI.

In the transistor 41, a signal BLC is input to a gate, one end of a current path is connected to the node BLI, and the other end of the current path is connected to a node SCOM. The transistor 41 is used to clamp the corresponding bit line BL to a potential according to the signal BLC.

In the transistor 42, a signal BLX is input to a gate, one end of a current path is connected to the node SCOM, and the other end of the current path is connected to a node SSRC.

In the transistor 43, a gate is connected to a node LAT_S, one end of a current path is connected to the node SSRC, and the other end of the current path is connected to a node SRCGND. For example, a ground voltage VSS is applied to the node SRCGND.

In the transistor 51, a gate is connected to the node LAT_S, a power supply voltage VDDSA is applied to one end of a current path, and the other end of the current path is connected to the node SSRC.

In the transistor 44, a signal XXL is input to a gate, one end of a current path is connected to the node SCOM, and the other end of the current path is connected to a node SEN.

In the transistor 45, a signal HLL is input to a gate, a voltage VSENP is applied to one end of a current path, and the other end of the current path is connected to the node SEN.

In the capacitor element 52, one electrode is connected to the node SEN, and a clock CLK is input to the other electrode.

In the transistor 47, a gate is connected to the node SEN, one end of a current path is connected to one end of a current path of the transistor 48, and a clock CLK is input to the other end of the current path.

In the transistor 48, a signal STB is input to a gate, and the other end of the current path is connected to a bus LBUS.

In the transistor 46, a signal BLQ is input to a gate, one end of a current path is connected to the node SEN, and the other end of the current path is connected to the bus LBUS.

In the transistor 49, a gate is connected to the bus LBUS, one end of a current path is connected to one end of a current path of the transistor 50, and a voltage VLSA is applied to the other end of the current path. A voltage VLSA may be, for example, a ground voltage VSS.

In the transistor 50, a signal LSL is input to a gate, and the other end of the current path is connected to the node SEN.

The latch circuits SDL, ADL, BDL, and CDL temporarily hold data. During a data writing operation, the sense amplifier section SA controls the bit line BL in accordance with the data held in the latch circuit SDL. For example, the other latch circuits ADL, BDL, and CDL are used for a multi-value operation of individual memory cell transistors holding data of 2 bits or more. Meanwhile, the number of latch circuits can be arbitrarily set, and is set in accordance with, for example, the amount of data (the number of bits) which is capable of being held by the memory cell transistor.

The latch circuit SDL includes low breakdown voltage n-channel MOS transistors 60 to 63 and low breakdown voltage p-channel MOS transistors 64 to 67.

In the transistor 60, a signal STL is input to a gate, one end of a current path is connected to the bus LBUS, and the other end of the current path is connected to the node LAT_S.

In the transistor 61, a signal STI is input to a gate, one end of a current path is connected to the bus LBUS, and the other end of the current path is connected to the node INV_S.

In the transistor 62, a gate is connected to the node INV_S, one end of a current path is grounded, and the other end of the current path is connected to the node LAT_S.

In the transistor 63, a gate is connected to the node LAT_S, one end of a current path is grounded, and the other end of the current path is connected to the node INV_S.

In the transistor 64, a gate is connected to the node INV_S, and one end of a current path is connected to the node LAT_S.

In the transistor 65, a gate is connected to the node LAT_S, and one end of a current path is connected to the node INV_S.

In the transistor 66, a signal SLL is input to a gate, one end of a current path is connected to the other end of the current path of the transistor 64, and a power supply voltage VDDSA is applied to the other end of the current path of the transistor 66.

In the transistor 67, a signal SLI is input to a gate, one end of a current path is connected to the other end of the current path of the transistor 65, and a power supply voltage VDDSA is applied to the other end of the current path of the transistor 67.

In the latch circuit SDL, a first inverter is constituted by the transistors 62 and 64, and a second inverter is constituted by the transistors 63 and 65. In addition, an output of the first inverter and an input (node LAT_S) of the second inverter are connected to the bus LBUS through the transistor 60 for data transmission, and an input of the first inverter and an output (node INV_S) of the second inverter are connected to the bus LBUS through the transistor 61 for data transmission. The latch circuit SDL holds data by the node LAT_S and holds the inverted data thereof by the node INV_S.

The latch circuits ADL, BDL, and CDL have the same configuration as that of the latch circuit SDL, and thus a description thereof will be omitted. A reference numeral and signal name of each transistor will be described by being distinguished from those of the latch circuit SDL as in FIG. 5. In addition, in each sense amplifier unit SAU, a sense amplifier section SA and four latch circuits SDL, ADL, BDL, and CDL are connected to each other through the bus LBUS so as to be able to transmit and receive data to and from each other.

The precharge circuit 30 precharges the bus LBUS. The precharge circuit 30 includes, for example, a low breakdown voltage n-channel MOS transistor 31. In the transistor 31, a signal LPC is input to a gate, one end of a current path is connected to the bus LBUS, and a voltage VHLB is applied to the other end of the current path. In addition, the precharge circuit 30 transmits the voltage VHLB to the bus LBUS to thereby precharge the bus LBUS.

The bus switch 32 connects the bus LBUS and the bus DBUS to each other. That is, the bus switch 32 connects the sense amplifier section SA and the latch circuit XDL to each other. The bus switch 32 includes, for example, a low breakdown voltage n-channel MOS transistor 33. In the transistor 33, a signal DSW is input to a gate, one end of a current path is connected to the bus LBUS, and the other end of the current path is connected to the bus DBUS.

Meanwhile, various signals in the sense amplifier unit SAU having the above-described configuration are output by, for example, the control circuit 5.

1.2 Threshold Voltage Distribution of Memory Cell Transistor

Next, a possible threshold voltage distribution of the memory cell transistor MT according to this embodiment will be described with reference to FIG. 6. Hereinafter, in this embodiment, a case where a memory cell transistor MT can hold data of eight values is described, but data capable of being held is not limited to the eight values. In this embodiment, the memory cell transistor MT may hold data of four values or more (data of 2 bits or more).

As shown in the drawing, a threshold voltage of each of the memory cell transistors MT has a discrete value, for example, a value included in any of eight distributions. These eight distributions are referred to as an "Er" level, an "A" level, a "B" level, a "C" level, a "D" level, an "E" level, an "F" level, and a "G" level in ascending order of a threshold voltage value.

Figures 6A, 6B:
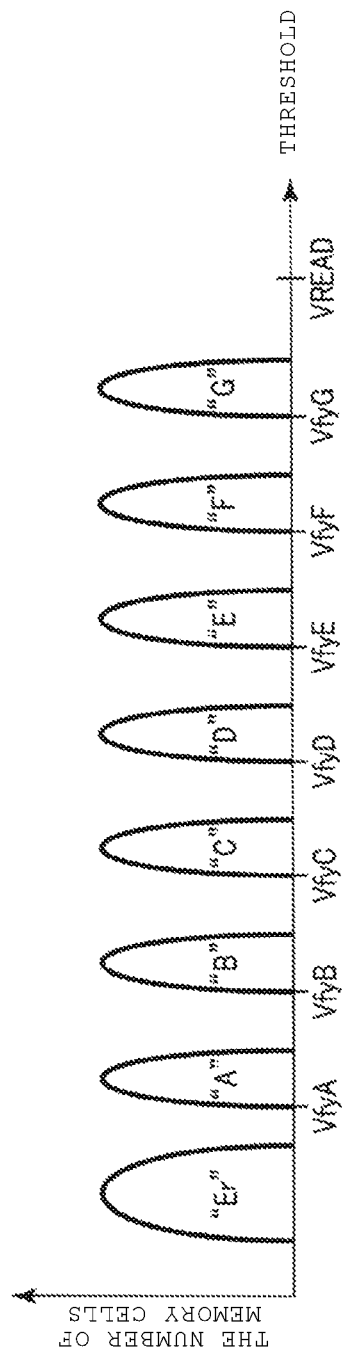
FIGS. 6A and 6B are diagrams showing a threshold voltage distribution of a memory cell transistor included in the semiconductor memory device according to the first embodiment.

As shown in FIG. 6B, the "Er" level is equivalent to, for example, a data erasure state. In addition, a threshold voltage included in the "Er" level is smaller than a voltage VfyA and has a positive or negative value.

The "A" to "G" levels are equivalent to a state in which charge is injected into a charge storage layer and data is written, and a threshold voltage included in each distribution has, for example, a positive or negative value. A threshold voltage included in the "A" level is a voltage VfyA or greater and is less than a voltage VfyB (here, VfyB>VfyA). A threshold voltage included in the "B" level is a voltage VfyB or greater and is less than a voltage VfyC (here, VfyC>VfyB). A threshold voltage included in the "C" level is a voltage VfyC or greater and is less than a voltage VfyD (here, VfyD>VfyC). A threshold voltage included in the "D" level is a voltage VfyD or greater and is less than a voltage VfyE (here, VfyE>VfyD). A threshold voltage included in the "E" level is a voltage VfyE or greater and is less than a voltage VfyF (here, VfyF>VfyE). A threshold voltage included in the "F" level is a voltage VfyF or greater and is less than a voltage VfyG (here, VfyG>VfyF). In addition, a threshold voltage included in the "G" level is a voltage VfyG or greater and is less than voltages VREAD and VPASS (here, VREAD>VfyG). Meanwhile, VREAD is a voltage applied to a non-selected word line WL during a data read-out operation, and VPASS is a voltage applied to a non-selected word line during a data writing operation.

As described above, each of the memory cell transistors MT has any of eight threshold voltage distributions, and thus can take eight types of states. These states are allocated to "000" to "111" as binary numbers, and each of the memory cell transistors MT can hold 3-bit data. The bits of the 3-bit data may be referred to as a high-order bit, a middle-order bit, and a low-order bit, respectively.

As shown in FIG. 6A, in this embodiment, regarding the allocation of data with respect to "Er" to "G" levels, data of the "Er" level is set to be "111", data of the "A" level is set to be "011", data of the "B" level is set to be "101", data of the "C" level is set to be "001", data of the "D" level is set to be "000", data of the "E" level is set to be "100", data of the "F" level is set to be "010", and data of the "G" level is set to be "110". Meanwhile, the allocation of data with respect to the levels can be arbitrarily set.

Although details will be described later, data is collectively written with respect to a plurality of memory cell transistors MT (for example, L memory cell transistors MT connected to all bit lines) which are connected to one word line WL. This unit is referred to as a page. In addition, a set of high-order bits that are collectively written may be referred to as an upper page, a set of middle-order bits may be referred to as a middle page, and a set of low-order bits may be referred to as a lower page.

Meanwhile, although a case where eight levels are discretely distributed is described as an example in FIG. 6, this is an ideal state, for example, immediately after data writing. Accordingly, adjacent levels may overlap each other during actual use. For example, after data writing, an upper end of the "Er" level and a lower end of the "A" level may overlap each other due to disturbance or the like. In this case, data is corrected using, for example, an ECC technique or the like.

1.3 Arithmetic Operation Using Sense Amplifier Section

Next, an AND operation and an OR operation using a sense amplifier section SA will be described.

1.3.1 AND Operation

First, an AND operation will be described. Hereinafter, as an example of the AND operation, a description will be given of a case where an AND operation of data held in the latch circuit BDL and data held in the latch circuit CDL is performed, and a result thereof is held in the latch circuit SDL. FIG. 7 shows pieces of data that are held in the latch circuits BDL, CDL, and SDL, the node SEN, and the bus LBUS with respect to each process of an AND operation. Table (a) of FIG. 7 shows an arithmetic process in a case where the latch circuits BDL and CDL hold data of '1'. Table (b) shows an arithmetic process in a case where the latch circuit BDL holds data of '1' and the latch circuit CDL holds data of '0'. Table (c) shows an arithmetic process in a case where the latch circuit BDL holds data of '0' and the latch circuit CDL holds data of '1'. Table (d) shows an arithmetic process in a case where the latch circuits BDL and CDL hold data of '0'. In addition, in FIG. 7, the notation of '1' indicates a signal (voltage) of an "H" level, and the notation of '0' indicates a signal (voltage) of an "L" level. In addition, in the tables of FIG. 7, a shaded portion indicates an arithmetic operation result in each step.

First, the control circuit 5 sets the signals LPC and BLQ to be at an "H" level to thereby set the transistors 31 and 46 to be in the on state (step 0). Thereby, the bus LBUS and the node SEN are precharged to an "H" level (data of '1'). The control circuit 5 sets the signals LPC and BLQ to be at an "L" level after the precharging.

Next, the control circuit 5 sets the signal BTL to be at an "H" level to thereby set the transistor 80 to be in the on state (step 1). Thereby, when the node LAT_B holds data of '1' (latch circuit BDL holds data of '1'), the bus LBUS holds data of '1' ((a) and (b) of FIG. 7). When the node LAT_B holds data of '0' (latch circuit BDL holds data of '0'), the bus LBUS holds data of '0' ((c) and (d) of FIG. 7).

Next, the control circuit 5 sets the signal LSL to be at an "H" level to thereby set the transistor 50 to be in the on state (step 2). Then, when the bus LBUS holds data of '1', the transistor 49 enters the on state, and thus the node SEN holds data of '0' ((a) and (b) of FIG. 7). When the bus LBUS holds data of '0', the transistor 49 enters the off state, and thus the node SEN holds data of '1' ((c) and (d) of FIG. 7). That is, when the latch circuit BDL holds data of '1', the node SEN holds data of '0'. When the latch circuit BDL holds data of '0', the node SEN holds data of '1'.

Next, the control circuit 5 precharges the bus LBUS, and then sets a signal CTL to be at an "H" level to thereby set the transistor 90 to be in the on state (step 3). Thereby, when the node LAT_C holds data of '1' (latch circuit CDL holds data of '1'), the bus LBUS holds data of '1' ((a) and (c) of FIG. 7). When the node LAT_C holds data of '0' (latch circuit CDL holds data of '0'), the bus LBUS holds data of '0' ((b) and (d) of FIG. 7).

Next, the control circuit 5 sets the signal CLL to be at an "H" level to thereby set the transistor 96 to be in the off state (step 4). That is, the control circuit 5 stops the supply of voltage to the node LAT_C.

Next, the control circuit 5 sets the signal STB to be at an "H" level to thereby set the transistor 48 to be in the on state (step 5). Then, when the node SEN holds data of '1' ((c) and (d) of FIG. 7), the transistor 47 enters the on state, and thus the bus LBUS holds data of '0'. When the node SEN holds data of '0' ((a) and (b) of FIG. 7), the transistor 47 enters to off state, and thus the bus LBUS is maintained in a state of data of '0' or data of '1'. Accordingly, the bus LBUS holds data of '1' when the node SEN holds data of '0' and the bus LBUS holds data of '1' (both the latch circuits BDL and CDL hold data of '1' ((a) of FIG. 7)), and holds data of '0' in the other cases ((b) to (d) of FIG. 7). That is, the bus LBUS holds results of an AND operation of data held in the latch circuits BDL and CDL.

Next, the control circuit 5 sets the signals SLL and STL to be at an "H" level to thereby set the transistor 66 to be in the off state and set the transistor 60 to be in the on state, and stores data of the bus LBUS in the latch circuit SDL (step 6).

1.3.2 OR Operation

Next, an OR operation will be described with reference to FIG. 8. Hereinafter, only differences from an AND operation will be described.

First, similarly to the case of an AND operation, the control circuit 5 precharges the bus LBUS and the node SEN to be at an "H" level (data of '1') (step 0).

Next, the control circuit 5 sets a signal BTI to be at an "H" level to thereby set the transistor 81 to be in the on state (step 1). Thereby, when the node INV_B holds data of '0', the bus LBUS holds data of '0'. When the node INV_B holds data of '1', the bus LBUS holds data of '1'. That is, the bus LBUS holds data of '0' when data of the latch circuit BDL is '1' ((a) and (b) of FIG. 8), and holds data of '1' when data of the latch circuit BDL is '0' ((c) and (d) of FIG. 8).

Next, similarly to the case of an AND operation, the control circuit 5 sets the signal LSL to be at an "H" level to thereby set the transistor 50 to be in the on state (step 2). In an OR operation, when data of the latch circuit BDL is '1' ((a) and (b) of FIG. 8), the node SEN holds data of '1'. When data of the latch circuit BDL is '0' ((c) and (d) of FIG. 8), the node SEN holds data of '0'.

Next, the control circuit 5 precharges the bus LBUS, and then sets the signal CTI to be at an "H" level to thereby set the transistor 91 to be in the on state (step 3). Thereby, the bus LBUS holds data of '0' when the node INV_C holds data of '0', and holds data of '1' when the node INV_C holds data of '1'. That is, the bus LBUS holds data of '0' when data of the latch circuit CDL is '1' ((a) and (c) of FIG. 8), and holds data of '1' when data of the latch circuit CDL is '0' ((b) and (d) of FIG. 8).

Next, the control circuit 5 sets a signal CLI to be at an "H" level to thereby set the transistor 97 to be in the off state (step 4). That is, the control circuit 5 stops the supply of a voltage to the node INV_C.

Next, similarly to the case of an AND operation, the control circuit 5 sets the signal STB to be at an "H" level to thereby set the transistor 48 to be in the on state (step 5). When the node SEN holds data of '1' ((a) and (b) of FIG. 8), the transistor 47 enters the on state, and thus the bus LBUS holds data of '0'. When the node SEN holds data of '0' ((c) and (d) of FIG. 8), the transistor 47 enters the off state, and thus bus LBUS is maintained in a state of data of '0' or data of '1'. Accordingly, the bus LBUS holds data of '1' when the node SEN holds data of '1' and the bus LBUS holds data of '0', that is, when both the latch circuits BDL and CDL hold data of '0' ((d) of FIG. 8), and holds data of '0' in the other cases ((a) to (c) of FIG. 8). That is, the bus LBUS holds inverted data of an OR operation of data held in the latch circuits BDL and CDL.

Next, the control circuit 5 sets the signal SLI and STI to be at an "H" level to thereby set the transistor 67 to be in the off state and set the transistor 61 to be in the on state, and stores inverted data of the bus LBUS in the latch circuit SDL (step 6).

1.4 Write Operation

Next, a data writing operation according to this embodiment will be briefly described. The writing operation roughly includes a programming operation and a verification operation.

The programming operation is an operation of injecting electrons into a charge storage layer to thereby increase a threshold voltage (or inhibiting injection to thereby maintain a threshold voltage). Hereinafter, an operation of increasing a threshold voltage is referred to as "programming of '0'" or "writing of '0'", and a bit line BL which is a target for programming of '0' is given data of '0'. On the other hand, an operation of maintaining a threshold voltage is referred to as "programming of '1'", "writing of '1'", or "writing inhibition", and a bit line BL which is a target for programming of '1' is given data of '1'.

The verification operation is an operation of reading out data after a programming operation is performed, to thereby determine whether or not a threshold voltage of a memory cell transistor MT reaches a target level. The memory cell transistor MT reaching the target level is inhibited from writing thereafter.

A combination of the above-mentioned programming operation and verification operation is repeated, and thus the threshold voltage of the memory cell transistor MT is increased to the target level.

1.4.1 Overall Flow of Writing Operation

Figure 9:
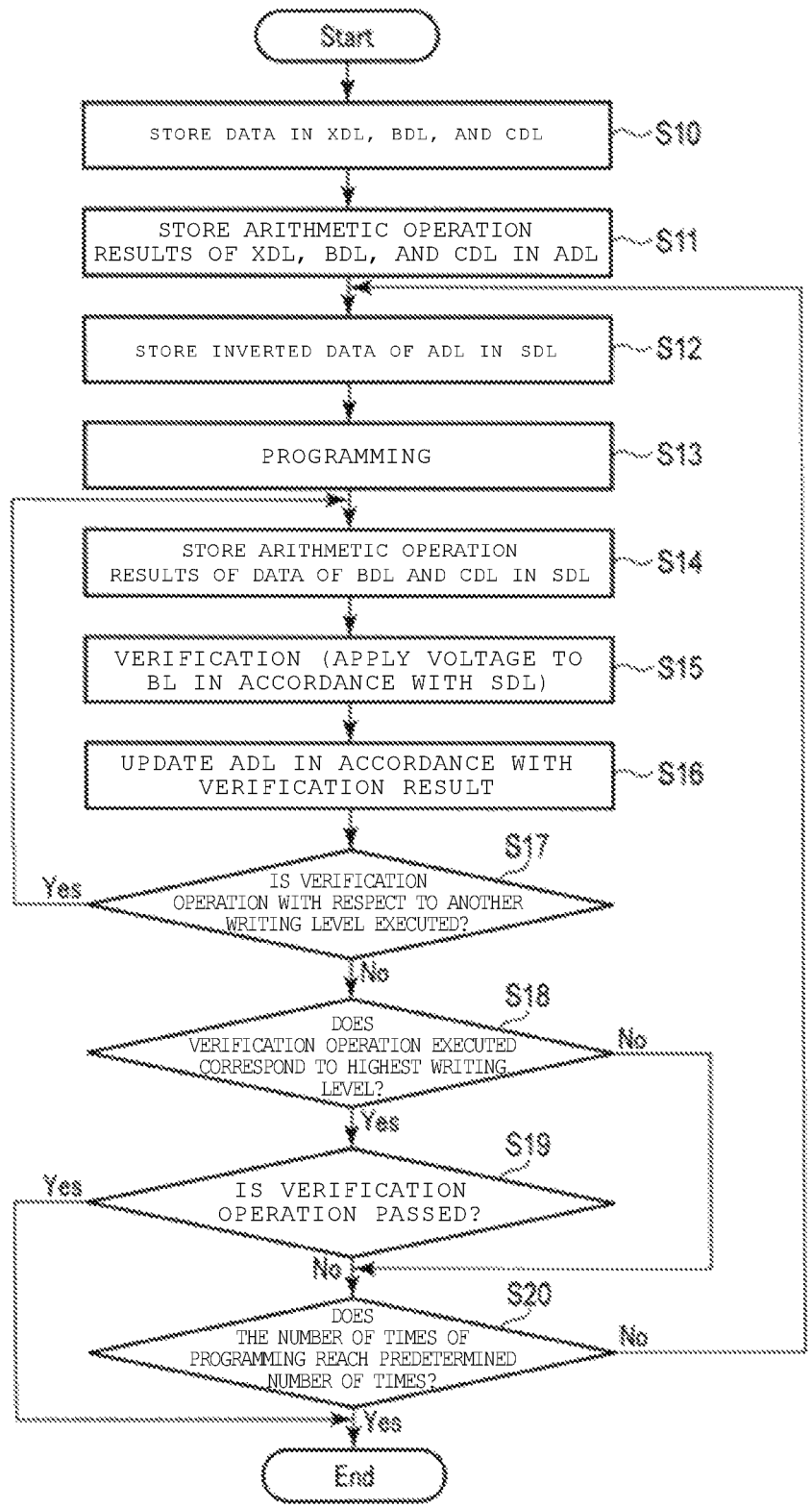
FIG. 9 is a flow chart showing a writing operation of the semiconductor memory device according to the first embodiment.

First, the overall flow of a writing operation will be described with reference to FIG. 9. FIG. 9 is a flow chart showing a flow of a writing operation.

As shown in the drawing, first, data received from an external controller is stored in the latch circuits XDL, BDL, and CDL (step S10). More specifically, for example, with respect to 3-bit data written in the memory cell transistor MT, the latch circuit XDL holds data of a low-order bit, the latch circuit BDL holds data of a middle-order bit, and the latch circuit CDL holds data of a high-order bit.

Next, in the sense amplifier unit SAU, the control circuit 5 performs an AND operation of data held in the latch circuits XDL, BDL, and CDL, and stores a result thereof in the latch circuit ADL (step S11). For example, data of '1' is stored in a latch circuit ADL corresponding to an "Er" level, and data of '0' is stored in latch circuits ADL corresponding to "A" to "G" levels.

Next, the control circuit 5 stores inverted data of the latch circuit ADL in the latch circuit SDL (step S12). For example, data of '0' is stored in a latch circuit SDL corresponding to an "Er" level, and data of '1' is stored in latch circuits SDL corresponding to "A" to "G" levels. In a programming operation, programming of '0' or programming of '1' is selected in accordance with data of the latch circuit SDL at this time.

Next, the control circuit executes a programming operation (step S13). More specifically, for example, when data of '0' is stored in the latch circuit SDL ("Er" level), programming of '1' is executed on the corresponding memory cell transistor MT. When data of '1' is stored in the latch circuit SDL ("A" to "G" levels), programming of '0' is executed.

Next, the control circuit 5 performs an arithmetic operation of data (data of a middle-order bit and a high-order bit) of the latch circuits BDL and CDL using an arithmetic expression (will be described later in detail) according to a writing level which is a target for a verification operation, and stores results thereof in the latch circuit SDL (step S14). In the verification operation, whether to apply a precharge voltage to a bit line BL is selected in accordance with the data of the latch circuit SDL at this time. The precharge voltage in the verification operation refers to a voltage which is applied to a bit line BL at the time of reading out data of a memory cell transistor MT, for example, a voltage which is higher than a ground voltage VSS.

Next, a verification operation is executed (step S15). More specifically, for example, when data of '0' is stored in the latch circuit SDL, a precharge voltage is applied to the corresponding bit line BL. When data of '1' is stored in the latch circuit SDL, for example, a voltage VSS is applied to the corresponding bit line BL, and a precharge voltage is not applied thereto.

Results of the verification operation are stored in the latch circuit SDL. For example, when the verification operation is passed, data of '0' is stored in the latch circuit SDL. When the verification operation fails, data of '1' is stored in the latch circuit SDL. In addition, data of '1' is also stored in a latch circuit SDL of a sense amplifier unit SAU which is not a target for verification.

Next, the control circuit 5 performs an OR operation of inverted data of the latch circuit SDL and data of the latch circuit ADL, and stores a result thereof in the latch circuit ADL (step S16). Thereby, the data of the latch circuit ADL is updated. More specifically, for example, when a verification operation with respect to an "A" level is executed, data of '0' is updated to data of '1' when the verification operation is passed in a latch circuit ADL corresponding to an "A" level, and data of '0' is maintained when the verification operation fails. In addition, in a latch circuit ADL that does not correspond to an "A" level, data which is held is maintained.

When a verification operation with respect to another writing level is continuously executed (Yes in step S17), the control circuit 5 returns to step S14 and performs an arithmetic operation according to a writing level which is a target for a verification operation.

When a verification operation with respect to another writing level is not continuously executed (No in step S17), the control circuit 5 terminates a writing operation, or returns to step S13 again to determine whether to execute programming.

Specifically, when a verification operation executed corresponds to the highest writing level (for example, a "G" level) (Yes in step S18), the writing operation is terminated when the verification operation is passed (Yes in step S19).

When a verification operation is not a verification operation with respect to the highest writing level (No in step S18) or when the verification operation fails even in a case of being a verification operation with respect to the highest writing level (No in step S19), the control circuit 5 determines whether or not the number of times of programming reaches a predetermined number of times (step S20).

In addition, when the number of times of programming reaches a predetermined number of times (Yes in step S20), the control circuit 5 terminates the writing operation.

When the number of times of programming does not reach a predetermined number of times (No in step S20), the control circuit 5 returns to step S12 to store inverted data of the latch circuit ADL in the latch circuit SDL, and then executes a programming operation (step S13).

1.4.2 Voltage of Each Wiring in Programming Operation

Next, a voltage of each wiring in a programming operation will be described with reference to FIG. 10.

Figure 10:
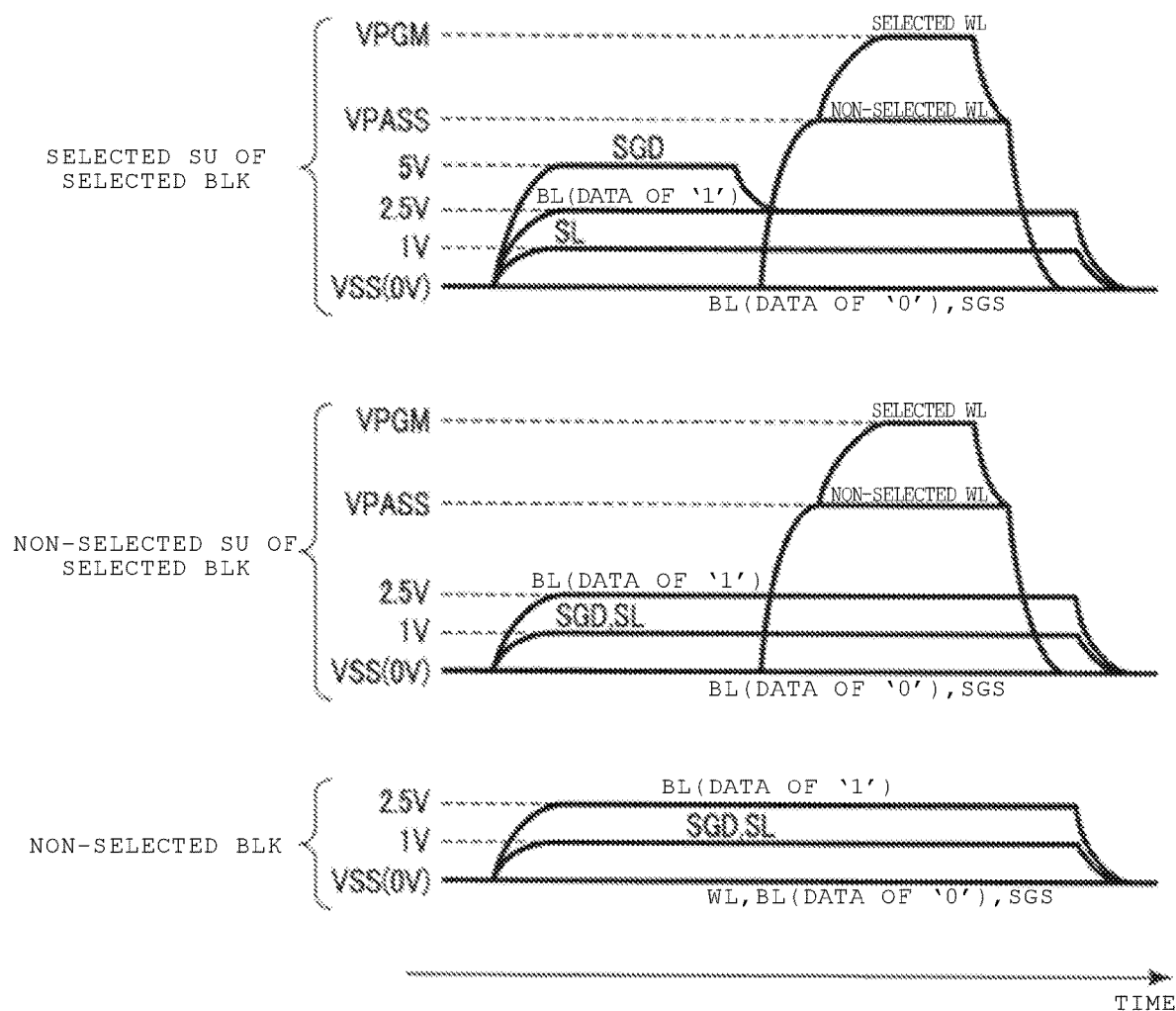
FIG. 10 is a timing chart showing a potential of each wiring in a writing operation of the semiconductor memory device according to the first embodiment.

FIG. 10 shows changes in a potential of each wiring in a programming operation. As shown in the drawing, first, the sense amplifier 4 transmits programming data to each bit line BL. A ground voltage VSS (for example, 0 V) s applied to a bit line BL given data of '0', as an "L" level. For example, 2.5 V is applied to a bit line BL given data of '1', as an "H" level.

In addition, the row decoder 3 selects one of the blocks BLK and selects one of the string units SU. In addition, for example, 5 V is applied to a select-gate line SGD in the selected string unit SU, thereby setting a selection transistor ST1 to be in the on state. On the other hand, a voltage VSS is applied to a select-gate line SGS, thereby setting a selection transistor ST2 to be in the off state.

Further, the row decoder 3 applies voltages 1 V and VSS respectively to select-gate lines SGD and SGS of a non-selected string unit SU in a selected block BLK and a non-selected string unit SU in a non-selected block BLK to thereby set the selection transistors ST1 and ST2 to be in the off state.

In addition, a source line SL is set to, for example, 1 V (potential higher than the potential of the select-gate line SGS).

Thereafter, the row decoder 3 sets the potential of the select-gate line SGD in the selected string unit SU in the selected block BLK to, for example, 2.5 V. The potential is a voltage that turns on a selection transistor ST1 corresponding to a bit line BL given data of '0' (for example, 0 V) and cuts off a selection transistor ST1 corresponding to a bit line BL given data of '1' (for example, 2.5 V).

In addition, the row decoder 3 selects one of the word lines WL in the selected block BLK, applies a voltage VPGM to the selected word line, and applies a voltage VPASS to the other non-selected word lines WL. The voltage VPGM is a high voltage for injecting electrons into a charge storage layer in accordance with a tunneling phenomenon, and the relation of VPGM>VPASS is established.

In the NAND string corresponding to the bit line BL which is a target for writing of '0', a selection transistor ST1 enters the on state. For this reason, a channel potential Vch of a memory cell transistor MT which is connected to the selected word line WL is set to 0 V. That is, a difference in potential between a control gate and a channel increases. As a result, electrons are injected into a charge storage layer, and thus a threshold voltage of the memory cell transistor MT is increased.

In the NAND string corresponding to the bit line BL which is a target for writing of '1', a selection transistor ST1 enters the cut-off state. For this reason, a channel of a memory cell transistor MT which is connected to the selected word line WL is set to be in an electrically floating state, and thus a channel potential Vch increases up to approximately a voltage VPGM due to capacity coupling to a word line WL or the like. That is, a difference in potential between a control gate and a channel decreases. As a result, electrons are not injected into a charge storage layer, and thus a threshold voltage of the memory cell transistor MT is maintained (the threshold voltage does not fluctuate to the extent that that a threshold voltage distribution level transitions to a higher distribution).

1.4.3 Verification Operation

Next, a verification operation in this embodiment will be described. In this embodiment, a bit line BL to which a precharge voltage is to be applied is selected during a verification operation in accordance with data of a latch circuit SDL (hereinafter, referred to as "selection precharge"). More specifically, for example, when data of '0' ("L" data) is held in the latch circuit SDL, a sense amplifier unit SAU applies a precharge voltage to the corresponding bit line BL. On the other hand, when data of '1' ("H" data) is held in the latch circuit SDL, the sense amplifier unit SAU applies, for example, a ground voltage VSS to the corresponding bit line BL and does not apply a precharge voltage. Hereinafter, a bit line to which a precharge voltage is applied is referred to as BL ("pre-charge"), and a bit line to which a precharge voltage is not applied is referred to as BL ("lockout").

1.4.3.1 Data Held in Latch Circuit SDL During Verification Operation

Next, data held in the latch circuit SDL during a verification operation will be described with reference to FIG. 11.

As shown in the drawing, in this embodiment, with respect to 3-bit data written in the memory cell transistor MT, the latch circuit XDL holds data of a low-order bit, the latch circuit BDL holds data of a middle-order bit, and the latch circuit CDL holds data of a high-order bit.

The latch circuit ADL holds information regarding pass (for example, set to be data of '1') and failure (for example, set to be data of '0') of verification. The example of FIG. 11 shows data of the latch circuit ADL in an initial state (during a first programming operation). More specifically, in the initial state, a latch circuit ADL corresponding to an "Er" level holds data of '1', and latch circuits ADL corresponding to "A" to "G" levels hold data of '0'.

In addition, the latch circuit ADL updates held data in accordance with a verification result. For example, when the latch circuit performs a verification operation with respect to the "A" level and passes the verification, data of a latch circuit ADL corresponding to an "A" level is updated from '0' to '1'. On the other hand, when the latch circuit fails in the verification, the data of the latch circuit ADL is maintained in a state of '0'.

During the verification operation, results of an arithmetic operation of data of the latch circuit BDL and data of the latch circuit CDL are stored in the latch circuit SDL. Accordingly, in the case of this embodiment, in the "A" level and the "F" level, the "B" level and the "E" level, the "C" level and the "D" level, and the "Er" level and the "G" level, pieces of data respectively stored in the latch circuits BDL and CDL are the same as each other, and thus arithmetic operation results become the same as each other. Accordingly, in the verification operation, a precharge voltage is applied to a bit line BL of a level which is a target for the verification operation and a bit line BL of a level in which data of a middle-order bit and data of a high-order bit are the same as each other. For example, a precharge voltage is applied to bit lines BL corresponding to an "A" level and an "F" level in a verification operation with respect to an "A" level, and a precharge voltage is applied to bit lines BL corresponding to an "A" level and an "F" level even in a verification operation with respect to an "F" level.

More specifically, in a verification operation with respect to an "A" level or an "F" level, data of a logical arithmetic expression; SDL=/(BDL×(/CDL)) is stored in a latch circuit SDL. Here, "/" means inversion of data, and "×" means an AND operation. Accordingly, in a verification operation with respect to an "A" level or an "F" level, data of '1' is stored in latch circuits SDL corresponding to "Er", "B" to "E", and "G" levels, and data of '0' is stored in latch circuits SDL corresponding to "A" and "F" levels.

Similarly, in a verification operation with respect to a "B" level or an "E" level, data of a logical arithmetic expression; SDL=/((/BDL)×CDL) is stored in a latch circuit SDL. Accordingly, in a verification operation with respect to a "B" level or an "E" level, data of '1' is stored in latch circuits SDL corresponding to "Er", "A", "C", "D", "F", and "G" levels, and data of '0' is stored in latch circuits SDL corresponding to "B" and "E" levels.

In a verification operation with respect to a "C" level or a "D" level, data of a logical arithmetic expression; SDL=/(((/BDL)×(/CDL)) is stored in a latch circuit SDL. Accordingly, in a verification operation with respect to a "C" level or a "D" level, data of '1' is stored in latch circuits SDL corresponding to "Er" to "B" and "E" to "G" levels, and data of '0' is stored in latch circuits SDL corresponding to "C" and "D" levels.

In a verification operation with respect to a "G" level, data of a logical arithmetic expression; SDL=/(BDL×CDL) is stored in a latch circuit SDL. Accordingly, in a verification operation with respect to a "G" level, data of '1' is stored in latch circuits SDL corresponding to "A" to "F" levels, and data of '0' is stored in latch circuits SDL corresponding to "Er" and "G" levels.

1.4.3.2 Voltage of Each Wiring in Verification Operation

Figure 12:
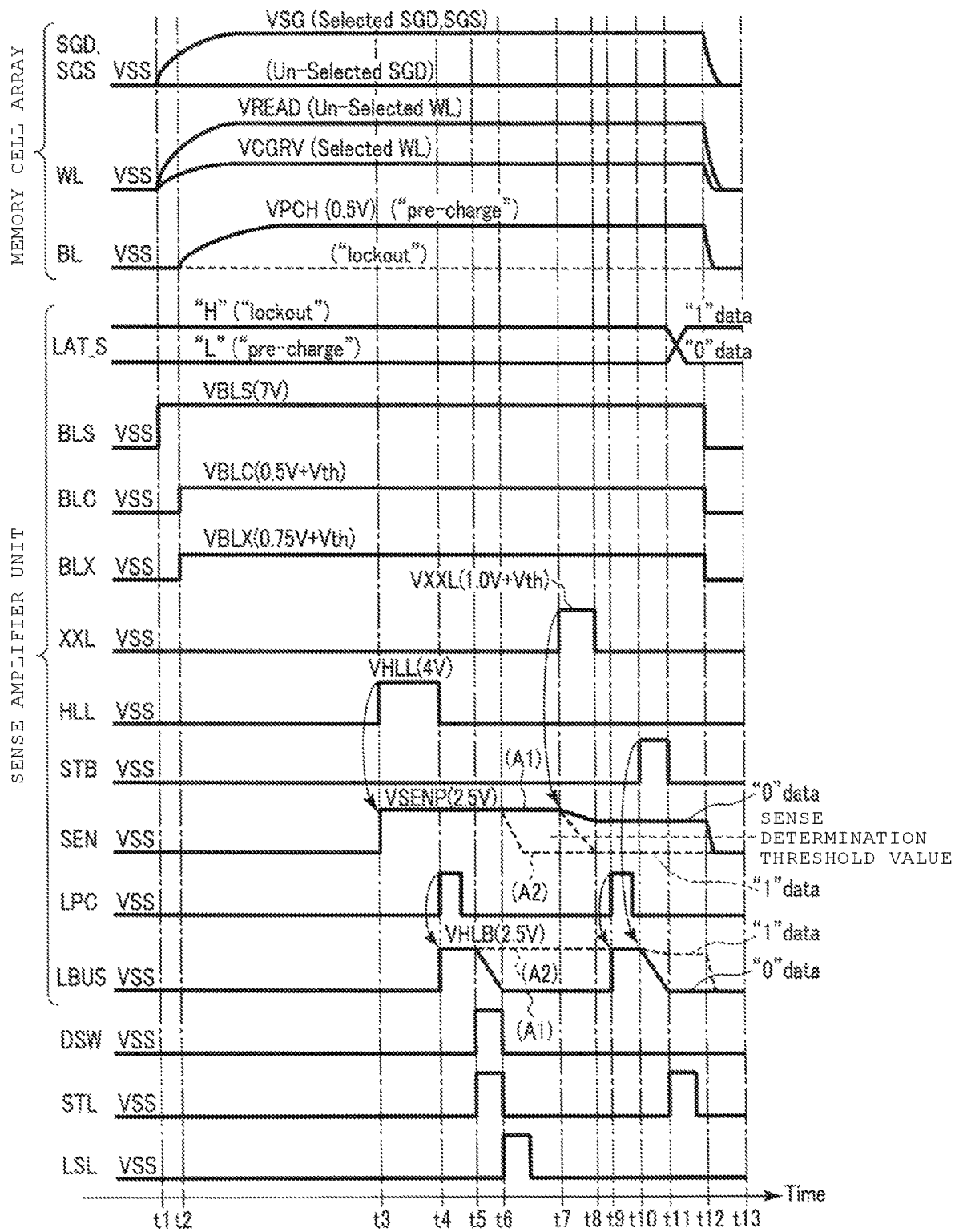
FIG. 12 is a timing chart showing a potential of each wiring during a verification operation of the semiconductor memory device according to the first embodiment.

Next, a voltage of each wiring in a verification operation will be described with reference to FIG. 12. FIG. 12 is a timing chart showing a voltage of each wiring in a verification operation in the memory cell array 2 and the sense amplifier unit SAU.

At time t1, the row decoder 3 applies a voltage VSG to select-gate lines SGD and SGS corresponding to a memory cell transistor MT which is a target for programming, and sets selection transistors ST1 and ST2 to be in the on state. The row decoder 112 applies a voltage VCGRV to a selected word line WL and applies VREAD to a non-selected word line WL. The voltage VCGRV is a voltage which is set in accordance with read-out data (verification level in the case of a verification operation). The voltage VREAD is a voltage for setting the memory cell transistor MT to be in the on state regardless of a threshold voltage of the memory cell transistor MT, and the relation of VREAD>VCGRV is established.

The control circuit 5 sets a signal BLS to be at an "H" level in the sense amplifier unit SAU. That is, a voltage VBLS (for example, 7 V) is applied to the gate of the transistor 40 to set the transistor 40 to be in the on state, thereby connecting the sense amplifier unit SAU and the corresponding bit line BL to each other.

At time t2, the control circuit 5 sets a signal BLC and a signal BLX to be at an "H" level in the sense amplifier unit SAU. That is, a voltage VBLC (for example, 0.5 V+Vtn) is applied to the gate of the transistor 41 to thereby set the transistor 41 to be in the on state. The voltage Vtn is a threshold voltage of a low breakdown voltage n-channel MOS transistor within the sense amplifier unit SAU. Similarly, a voltage VBLX (for example, 0.75 V+Vtn) is applied to the transistor 42 to thereby set the transistor 42 to be in the on state. A relationship between the voltage VBLX and the voltage VBLC is VBLX>VBLC.

At this time, when data of '0', that is, "L" data is held in the latch circuit SDL, the transistor 51 enters the on state, and a voltage VDDSA is applied to the transistor 42. Accordingly, a precharge voltage VPCH (for example, 0.5 V) which is clamped by the transistor 41 is applied to a bit line BL ("pre-charge"). In addition, a cell current Icell flows from a bit line BL side to a source line SL side in accordance with a threshold voltage Vtc of a memory cell transistor MT which is a target for verification. More specifically, when the threshold voltage Vtc is lower than a voltage VCGRV and the memory cell transistor MT is set to be in the on state, that is, when programming is not completed, a cell current Icell flows in the corresponding sense amplifier unit SAU. On the other hand, when the threshold voltage Vtc is higher than a voltage VCGRV and the memory cell transistor MT is set to be in the off state, that is, when programming is completed, the memory cell transistor MT enters the off state, and a cell current Icell does not flow in the corresponding sense amplifier unit SAU.

On the other hand, when data of '1', that is, "H" data is held in the latch circuit SDL, the transistor 43 enters the on state, and, for example, a voltage VSS is applied to the transistor 42 through the node SRCGND. Accordingly, for example, a voltage VSS is applied to a bit line BL ("lock-out").

At time t3, the control circuit 5 sets a signal HLL to be at an "H" level. More specifically, a voltage VHLL (for example, 4 V) is applied to the gate of the transistor 45 to thereby set the transistor 45 to be in the on state. Thereby, a voltage VSENP (for example, 2.5 V) is applied to the node SEN.

In addition, after the charging of the node SEN is completed, the control circuit 5 sets a signal HLL to be at an "L" level to thereby set the transistor 45 to be in the off state.

At time t4, the control circuit 5 sets a signal LPC to be at an "H" level to thereby set the transistor 31 of the precharge circuit 30 to be in the on state. Thereby, a voltage VHLB (for example, 2.5 V) is applied to the bus LBUS. In addition, after the charging of the bus LBUS is completed, the control circuit 5 sets a signal LPC to be at an "L" level to thereby set the transistor 31 to be in the off state.

At time t5, the control circuit 5 sets a signal STL to be at an "H" level to thereby set the transistor 60 to be in the on state in the latch circuit SDL. Thereby, a bus LBUS of a sense amplifier unit SAU in which a latch circuit SDL holds data of '1' ("H" data), that is, a sense amplifier unit SAU in which a precharge voltage VPCH is not applied, is set to be at an "H" level. For example, in a verification operation with respect to an "A" level, buses LBUS of sense amplifier units SAU corresponding to "Er", "B" to "E", and "G" levels are set to be at an "H" level.

The control circuit 5 sets a signal DSW of the bus switch 32 to be at an "H" level to thereby set the transistor 33 to be in the on state. In addition, a bus LBUS and either a node (for example, a node LAT_X) which holds data of a latch circuit XDL or a node (for example, a node INV_X) which holds inverted data are connected to each other in accordance with a verification level.

Thereby, a bus LBUS of a sense amplifier unit SAU which is not a target for verification but applies a precharge voltage VPCH is set to be at an "H" level. Specifically, for example, in a verification operation for an "A" level, a latch circuit XDL corresponding to an "A" level holds data of '1', and a latch circuit XDL corresponding to an "F" level holds data of '0'. Consequently, a bus LBUS and a node (for example, a node INV_X) which holds inverted data of a latch circuit XDL are connected to each other, and thus a bus LBUS of a sense amplifier unit SAU corresponding to an "A" level is set to be at an "L" level and a bus LBUS of a sense amplifier unit SAU corresponding to an "F" level is set to be at an "H" level.

In addition, for example, in a verification operation for an "F" level, a bus LBUS and a node (for example, a node LAT_X) which holds data of a latch circuit XDL are connected to each other, and thus a bus LBUS of a sense amplifier unit SAU corresponding to an "A" level is set to be at an "H" level, and a bus LBUS of a sense amplifier unit SAU corresponding to an "F" level is set to be at an "L" level. Accordingly, a bus LBUS of a sense amplifier unit SAU (reference numeral (A1) in FIG. 12) which is a target for verification is set to be at an "L" level, and a bus LBUS of a sense amplifier unit SAU (reference numeral (A2) in FIG. 12) which is not a target for a verification operation is set to be at an "H" level.

At time t6, the control circuit 5 sets a signal LSL to be at an "H" level to thereby set the transistor 50 to be in the on state. When a bus LBUS is at an "L" level, the transistor 49 enters the off state. Accordingly, a node SEN of a sense amplifier unit SAU which is a target for a verification operation maintains an "H" level, that is, a voltage VSENP (2.5 V) (A1). On the other hand, when a bus LBUS is at an "H" level, the transistor 49 enters the on state. Accordingly, a node SEN of a sense amplifier unit SAU which is not a target for a verification operation is set to be at an "L" level (A2).

At time t7, the control circuit 5 sets a signal XXL to be at an "H" level. That is, the control circuit 5 applies a voltage VXXL (for example, 1.0 V+Vtn) to the gate of the transistor 44 to thereby set the transistor 44 to be in the on state. As a result, in a sense amplifier unit SAU which is a target for a verification operation, a voltage (for example, 1 V) which is clamped by the transistor 44 is applied from a node SEN to a node SCOM. In addition, in a sense amplifier unit SAU which is not a target for a verification operation, a node SEN is at an "L" level, and thus a voltage is not applied.

At this time, in a sense amplifier unit SAU which is a target for a verification operation, that is, a sense amplifier unit SAU corresponding to a bit line BL ("pre-charge"), a memory cell transistor MT which is a target for a verification operation is set to be in the on state, a cell current Icell flows from the sense amplifier unit SAU to the bit line BL ("pre-charge"). For this reason, a voltage of a node SEN drops significantly. On the other hand, when a memory cell transistor MT which is a target for a verification operation is set to be in the off state, a cell current Icell hardly flows from a sense amplifier unit SAU to a bit line BL ("pre-charge"). For this reason, a voltage of a node SEN is reduced very little if at all.

At time t8, the control circuit 5 sets a signal XXL to be at an "L" level to thereby set the transistor 44 to be in the off state.

At time t9, the control circuit 5 sets a signal LPC to be at an "H" level to thereby set the transistor 31 to be in the on state. Thereby, a voltage VHLB (for example, 2.5 V) is applied to a bus LBUS. In addition, after the charging of the bus LBUS is completed, the control circuit 5 sets a signal LPC to be at an "L" level to thereby set the transistor 31 to be in the off state.

At time t10, the control circuit 5 sets a signal STB to be at an "H" level to thereby set the transistor 48 to be in the on state.

In a sense amplifier unit SAU which is a target for a verification operation, when a voltage of a node SEN is lower than a sense determination threshold value, that is, a threshold voltage of the transistor 47, the transistor 47 enters the off state. Accordingly, a voltage of a bus LBUS is hardly reduced. As a result, the bus LBUS holds data of '1' ("H" data). On the other hand, when the voltage of the node SEN is higher than the sense determination threshold value, the transistor 47 enters the on state. Accordingly, the voltage of the bus LBUS is greatly reduced. As a result, the bus LBUS holds data of '0' ("L" data). In addition, in a sense amplifier unit SAU which is not a target for a verification operation, a node SEN is at an "L" level, and thus the transistor 47 enters the off state. Accordingly, the bus LBUS holds data of '1'.

That is, when the corresponding memory cell transistor MT is a target for a verification operation, a bus LBUS that passes the verification operation holds data of '0', and a bus LBUS that fails in the verification operation holds data of '1'. In addition, when the corresponding memory cell transistor MT is not a target for a verification operation, a bus LBUS holds data of '1'.

At time t11, the control circuit 5 sets a signal STB to be at an "L" level to thereby set the transistor 47 to be in the off state. In addition, the control circuit 5 stores data of a bus LBUS in a latch circuit SDL. For example, in the latch circuit SDL, the control circuit 5 sets a signal SLL to be at an "H" level to thereby set the transistor 66 to be in the off state, and sets a signal STL to be at an "H" level to thereby set the transistor 60 to be in the on state, thereby taking up data held by the bus LBUS in a node LAT_S. Thereby, data of '0' is stored in a latch circuit SDL of a sense amplifier unit SAU which is a target for a verification operation when the verification operation is passed, and data of '1' is stored therein when the verification operation fails. In addition, data of '1' is stored in a latch circuit SDL of a sense amplifier unit SAU which is not a target for a verification operation.

At times t12 to t13, a recovery operation is performed, and a verification operation is terminated.

After the verification operation is terminated, the control circuit 5 performs an OR operation of inverted data of data stored in a latch circuit SDL and data of a latch circuit ADL, and stores a result thereof in the latch circuit ADL. Thereby, the data of the latch circuit ADL is updated.

Meanwhile, the above-mentioned verification operation can also be applied to a read-out operation.

1.4.4 Specific Example of Write Operation

A writing operation according to this embodiment will be described in more detail. In FIGS. 13 and 14, a case where data is written by a combination of a programming operation and a verification operation being repeated 19 times is shown as an example. Hereinafter, such a repetition operation is referred to as a "loop".

FIG. 13 shows a target level of a verification operation performed in each loop. As shown in the drawing, in first and second loops, verification is performed with respect to only an "A" level. In other words, during the verification operation, a voltage VfyA is applied to a selected word line WL, and voltages VfyB to VfyG are not applied. Subsequently, in third and fourth loops, a verification operation is performed with respect to the "A" level and a "B" level. In other words, during the verification operation, voltages VfyA and VfyB are sequentially applied to a selected word line WL, and voltages VfyC to VfyG are not applied.

In fifth and sixth loops, a verification operation is performed with respect to the "A" level, the "B" level, and a "C" level. In other words, during the verification operation, voltages VfyA, VfyB, and VfyC are sequentially applied to a selected word line WL, and voltages VfyD to VfyG are not applied. In addition, the verification operation targeted at the "A" level is completed in the sixth loop. This is because a fact that programming for the "A" level is substantially completed by, for example, six loops is statistically obtained.

In addition, in seventh and eighth loops, a verification operation is performed with respect to the "B" level, the "C" level, and a "D" level. In other words, voltages VfyB, VfyC, and VfyD are sequentially applied to a selected word line WL during the verification operation. In addition, the verification operation targeted at the "B" level is completed in the eighth writing operation.

Further, in ninth and tenth loops, a verification operation is performed with respect to the "C" level, the "D" level, and an "E" level. In other words, voltages VfyC, VfyD, and VfyE are sequentially applied to a selected word line WL during the verification operation. In addition, the verification operation targeted at the "C" level is completed in the tenth loop.

Hereinafter, writing for up to a "G" level is similarly performed, and a loop is repeated a maximum of 19 times.

That is, a verification operation with respect to an "A" level is performed in first to sixth loops. A verification operation with respect to a "B" level is performed in third to eighth loops. A verification operation with respect to a "C" level is performed in fifth to tenth loops. A verification operation with respect to a "D" level is performed in seventh to twelfth loops. A verification operation with respect to an "E" level is performed in ninth to fourteenth loops. A verification operation with respect to an "F" level is performed in eleventh to sixteenth loops. A verification operation with respect to a "G" level is performed in fourteenth to nineteenth loops.

FIG. 14 corresponds to FIG. 13 and shows the state of a bit line BL according to a target level of writing during a programming operation performed in each loop. In FIG. 14, the notation of '1' means that data of '1' is given (programming of '1') to the corresponding bit line BL, the notation of '0' means that data of '0' is given (programming of '0') to the corresponding bit line BL.

As shown in the drawing, when a threshold voltage of a memory cell transistor MT has to be maintained at an "Er" level, data of '1' is given to a bit line BL throughout all loops. That is, a selection transistor ST1 is set to be in the cut-off state during a writing operation.

A programming of '0' operation is performed in first to sixth loops when a target level of a threshold voltage is an "A" level, in other words, with respect to a memory cell transistor MT in which a threshold voltage has to be increased from a value within the "Er" level to a value within the "A" level. This corresponds to a loop in which a verification operation with respect to the "A" level is performed. data of '0' is given to a bit line BL before the bit line passes verification, and data of '1' is given thereto after the bit line passes the verification. In addition, data of '1' is given to a bit line BL even in a seventh loop in which a programming operation is completed and the subsequent loops, and thus the bit line is inhibited from writing.

When a target level is a "B" level, in other words, with respect to a memory cell transistor MT in which a threshold voltage has to be increased from a value within an "Er" level to a value within a "B" level, a programming of '0' operation may be performed in first to eighth loops.

Similarly, a programming operation from a "C" level to a "G" level is performed.

Figure 15:
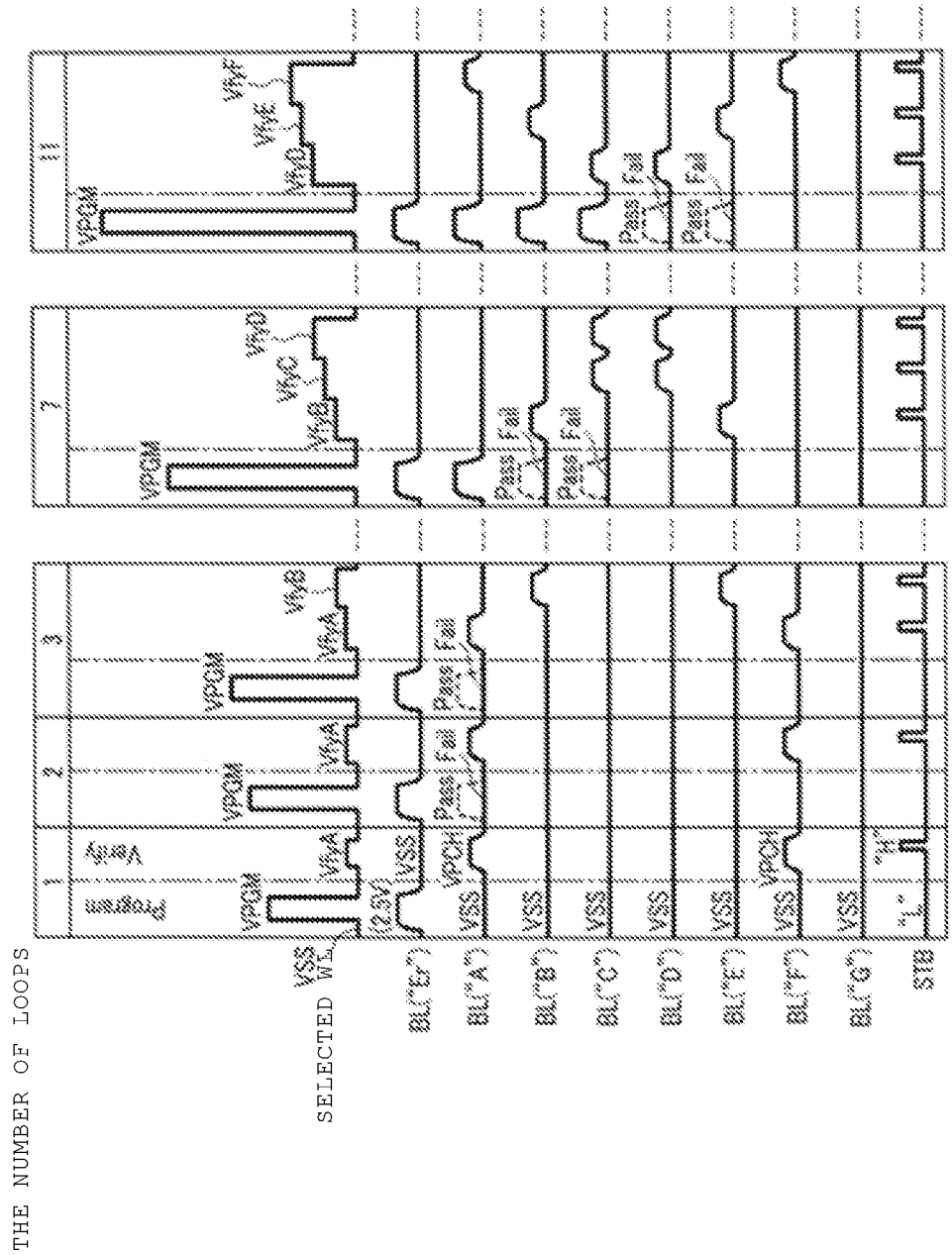
FIG. 15 is a timing chart showing voltages of a selected word line, bit lines, and a signal STB in a writing operation of the semiconductor memory device according to the first embodiment.

The state of a potential of each wiring in the above-described operation is shown in FIG. 15. FIG. 15 shows changes over time in a potential of a selected word line WL, potentials of bit lines BL (hereinafter, referred to as bit lines BL ("Er") to BL ("G")) which write data at "Er" to "G" levels, and a potential of a signal STB in a sense amplifier unit SAU in first to third, seventh, and eleventh loops.

As shown in the drawing, in the first loop, programming of '0' is performed on bit lines BL ("A") to BL ("G"). That is, a voltage VPGM is applied to the selected word line WL, for example, 2.5 V is applied to the bit line BL ("Er"), and, for example, a voltage VSS is applied to the bit lines BL ("A") to BL ("G"). In addition, a verification operation with respect to the "A" level is performed. That is, a verification voltage VfyA is applied to the selected word line WL. At this time, a precharge voltage VPCH (for example, 0.5 V) is applied to the bit lines BL ("A") and BL ("F").

In the second loop, programming of '0' is performed on the bit line BL ("A") and the bit lines BL ("B") to BL ("G") that fail in a first verification operation with respect to an "A" level. At this time, a voltage VPGM applied to the selected word line WL is stepped up. In addition, similarly to the first loop, a verification operation with respect to the "A" level is executed.

Similarly to the second loop, in the third loop, programming of '0' is performed on the bit line BL ("A") and the bit lines BL ("B") to BL ("G") that fail in the verification operation with respect to an "A" level. At this time, a voltage VPGM applied to the selected word line WL is stepped up. In addition, similarly to the first and second loops, first, a verification operation with respect to the "A" level is executed. Next, a verification operation with respect to the "B" level is executed. In the verification operation with respect to the "B" level, a verification voltage VfyB is applied to the selected word line WL. At this time, a precharge voltage VPCH (for example, 0.5 V) is applied to the bit lines BL ("B") and BL ("E").

The same process is repeated, and programming of '0' is performed on the bit lines BL ("B") and BL ("C") and the bit lines BL ("D") to BL ("G") that fail in verification, in the seventh loop. At this time, a voltage VPGM applied to the selected word line WL is stepped up from a sixth programming operation not shown in the drawing. In addition, verification operations with respect to the ("B") to ("D") levels are performed. In the verification operation with respect to the "B" level, a verification voltage VfyB is applied to the selected word line WL. At this time, a precharge voltage VPCH (for example, 0.5 V) is applied to the bit lines BL ("B") and BL ("E"). In the verification operation with respect to the "C" level, a verification voltage VfyC is applied to the selected word line WL. At this time, a precharge voltage VPCH (for example, 0.5 V) is applied to the bit lines BL ("C") and BL ("D"). In the verification operation with respect to the "D" level, a verification voltage VfyD is applied to the selected word line WL. At this time, a precharge voltage VPCH (for example, 0.5 V) is applied to the bit lines BL ("C") and BL ("D").

In addition, in the eleventh loop, programming of '0' is performed on the bit lines BL ("D") and BL ("E") in which verification fails and the bit lines BL ("F") and BL ("G"). At this time, a voltage VPGM applied to the selected word line WL is stepped up from a tenth programming operation not shown in the drawing. In addition, verification operations with respect to the ("D") to ("F") levels are performed. In the verification operation with respect to the "D" level, a verification voltage VfyD is applied to the selected word line WL. At this time, a precharge voltage VPCH (for example, 0.5 V) is applied to the bit lines BL ("C") and BL ("D"). In a verification operation with respect to the "E" level, a verification voltage VfyE is applied to the selected word line WL. At this time, a precharge voltage VPCH (for example, 0.5 V) is applied to the bit lines BL ("B") and BL ("E"). In a verification operation with respect to the "F" level, a verification voltage VfyF is applied to the selected word line WL. At this time, a precharge voltage VPCH (for example, 0.5 V) is applied to the bit lines BL ("A") and BL ("F").

As described above, for example, when focusing on the bit line BL ("A"), a precharge voltage VPCH is applied to the bit line BL ("A") in first to sixth loops in which a verification operation with respect to the "A" level is performed and eleventh to sixteenth loops in which a verification operation with respect to the "F" level is performed, and a precharge voltage VPCH is not applied thereto in seventh to tenth and seventeenth to nineteenth loops.

1.4.5 Specific Example of Data Held in Latch Circuit

Figure 16:
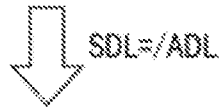
FIG. 16 is a diagram showing data held in a latch circuit in a writing operation of the semiconductor memory device according to the first embodiment.
Figure 17:
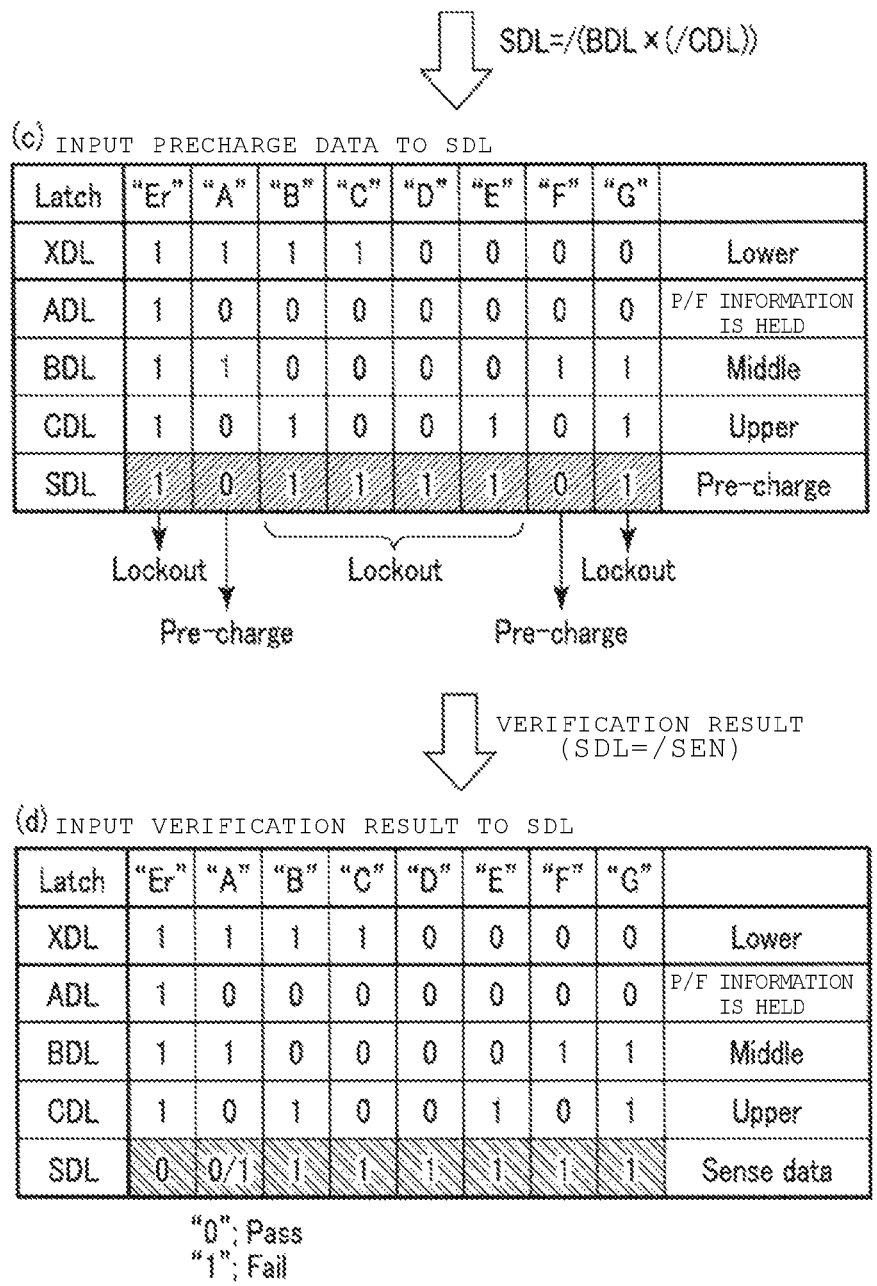
FIG. 17 is a diagram showing data held in a latch circuit in a writing operation of the semiconductor memory device according to the first embodiment.

Next, a specific example of data which is held in latch circuits XDL, ADL, BDL, CDL, and SDL in a data writing operation will be described with reference to FIGS. 16 to 18 particularly focusing on a first loop. FIGS. 16 to 18 are diagrams showing pieces of data which are held in the latch circuits XDL, ADL, BDL, CDL, and SDL.

First, as shown in Table (a) of FIG. 16, the latch circuit XDL receives programming data (3-bit data) from an external controller through a data line IO. The latch circuit XDL transmits a middle-order bit of the programming data to the latch circuit BDL through a bus LBUS, transmits a high-order bit to the latch circuit CDL, and holds a low-order bit therein. In addition, a sense amplifier unit SAU performs an AND operation of pieces of data of the latch circuits XDL, BDL, and CDL in a sense amplifier section SA, and stores a result thereof in the latch circuit ADL (ADL=XDL×BDL×CDL). Meanwhile, data of the latch circuit ADL could possibly be given from the external controller.

Next, as shown in Table (b), the sense amplifier unit SAU stores inverted data of the latch circuit ADL in the latch circuit SDL (SDL=/ADL).

As a result, data of '0' is stored in a latch circuit SDL corresponding to data of an "Er" level. In addition, data of '1' is stored in latch circuits SDL corresponding to pieces of data of "A" to "G" levels.

In addition, first programming is executed in accordance with data of the latch circuit SDL. That is, programming of '1' is executed in a sense amplifier unit SAU corresponding to data of an "Er" level, and programming of '0' is executed in sense amplifier units SAU corresponding to pieces of data of "A" to "G" levels.

Next, as shown in Table (c) of FIG. 17, preparation for executing a verification operation with respect to an "A" level is made. More specifically, in a case of a verification operation with respect to an "A" level, the control circuit 5 performs an AND operation of data of a latch circuit BDL and inverted data of a latch circuit CDL using a sense amplifier section SA, and stores inverted data of a result thereof in a latch circuit SDL (SDL=/(BDL×(/CDL)).

As a result, data of '0' is stored in latch circuits SDL corresponding to pieces of data of "A" and "F" levels, and data of '1' is stored in latch circuits SDL corresponding to pieces of data of the other levels.

In addition, a verification operation with respect to an "A" level is performed on the basis of data of a latch circuit SDL. That is, a precharge voltage VPCH is applied to bit lines BL ("pre-charge") which are connected to sense amplifier units SAU corresponding to pieces of data of "A" and "F" levels, and a precharge voltage VPCH is not applied to bit lines BL ("lockout") which are connected to sense amplifier units SAU corresponding to pieces of data of the other levels.

Next, as shown in Table (d), a result of a verification operation with respect to an "A" level is stored in a latch circuit SDL (SDL=LBUS=/SEN).

As a result, in a latch circuit SDL corresponding to data of an "A" level, data of '0' is stored when the verification operation is passed, and data of '1' is stored when the verification operation fails. In addition, data of '1' is stored in latch circuits SDL corresponding to pieces of data of the other levels.

Next, as shown in Table (e) of FIG. 18, a sense amplifier unit SAU performs an OR operation of data of a latch circuit ADL and inverted data of a latch circuit SDL in a sense amplifier section SA, and stores a result thereof in the latch circuit ADL (ADL=ADL+(/SDL); "+" means an OR operation).

As a result, in a latch circuit ADL corresponding to data of an "A" level, data of '1' is stored when the verification operation with respect to an "A" level is passed, and data of '0' is stored when the verification operation fails.

Next, as shown in Table (f), preparation for executing a second programming operation is made. A sense amplifier unit SAU stores inverted data of a latch circuit ADL in a latch circuit SDL.

As a result, data of '0' is stored in a latch circuit SDL corresponding to data of an "Er" level. In a latch circuit SDL corresponding to data of an "A" level, data of '0' is stored when a verification operation with respect to an "A" level is passed, and data of '1' is stored when the verification operation with respect to an "A" level fails. In addition, data of '1' is stored in latch circuits SDL corresponding to pieces of data of the other levels.

In addition, second programming is executed in accordance with data of a latch circuit SDL. That is, in a sense amplifier unit SAU corresponding to data of an "Er" level, programming of '1' is executed. In a sense amplifier unit SAU corresponding to data of an "A" level, programming of '1' is executed when a verification operation with respect to an "A" level is passed, and programming of '0' is executed when the verification operation with respect to an "A" level fails. In addition, programming of '0' is executed in sense amplifier units SAU corresponding to pieces of data of "B" to "G" levels.

Next, similarly to the first loop, a verification operation with respect to an "A" level is performed.

Hereinafter, similarly, writing operations in a third loop and the subsequent loops are performed. For example, in the third loop, verification operations with respect to "A" and "B" levels are performed. In this case, first, the verification operation with respect to the "A" level is performed, and data of a latch circuit ADL is updated using a result of the verification operation. Next, the verification operation with respect to the "B" level is performed, and data of the latch circuit ADL is further updated using a result of the verification operation. That is, data of the latch circuit ADL may be updated for each verification operation.

1.5 Effects According to This Embodiment

According to a configuration of this embodiment, it is possible to improve processing capability. This effect will be described below.

For example, a memory cell transistor MT capable of holding data of four values (2 bits) or more uses a method (selection precharge) of performing a verification operation by applying a precharge voltage to only a bit line BL connected to a memory cell transistor MT corresponding to a writing level which is a target for a verification operation, during a verification operation. In this case, in a sense amplifier unit SAU, the presence or absence of a precharge voltage applied to a bit line BL is determined on the basis of write data.

In addition, in the sense amplifier unit SAU, a portion (for example, data of 1 bit) of the write data may be held in a latch circuit XDL which is used for the transmission and reception of data between the sense amplifier unit SAU and an external controller in order to reduce the number of latch circuits built into the sense amplifier unit. However, when a plurality of sense amplifier units SAU and a plurality of latch circuits XDL are connected to each other through one bus DBUS in common, the transmission and reception of a signal between the sense amplifier units SAU and the latch circuits XDL are serially performed. For this reason, in many cases, the transmission and reception of data between the sense amplifier units SAU and the latch circuits XDL may become slower than the transmission and reception of a signal between a sense amplifier section SA and a latch circuit within the sense amplifier unit SAU.

Accordingly, when a verification operation is performed by selection precharge, a latch circuit XDL holding a portion of write data results in the necessity for a sense amplifier unit SAU to access the latch circuit XDL for each verification operation in order to determine whether to apply a precharge voltage. More specifically, the sense amplifier unit SAU performs an arithmetic operation of data of a latch circuit within the sense amplifier unit SAU and data of the latch circuit XDL. In addition, whether to apply a precharge voltage is controlled in accordance with a result of the arithmetic operation. For this reason, a processing time until the precharge voltage is started to be applied is increased, and a processing speed of the verification operation is reduced.

On the other hand, in the configuration according to this embodiment, in an operation of writing data in a memory cell transistor MT capable of holding data of four values (2 bits) or more, a latch circuit XDL holds a portion of the write data. In addition, when a verification operation is performed by selection precharge, a sense amplifier unit SAU determines whether to apply a precharge voltage in accordance with data which is held in a latch circuit within the sense amplifier unit SAU. Accordingly, access to the latch circuit XDL can be omitted, and thus it is possible to improve a processing speed of a verification operation. Therefore, it is possible to improve the processing capability of the semiconductor memory device.

Further, in the configuration according to this embodiment, an arithmetic operation is performed using a portion of write data which is held by a latch circuit within a sense amplifier unit SAU. For example, in data writing of 3 bits (eight values), when the latch circuit within the sense amplifier unit SAU holds data of 2 bits, the sense amplifier unit SAU performs an arithmetic operation of the data of 2 bits. Accordingly, the number of bits on which arithmetic processing is to be performed can be reduced with respect to the number of bits of data to be written, and thus it is possible to improve a processing speed. Therefore, it is possible to improve the processing capability of the semiconductor memory device.

Further, in the configuration according to this embodiment, it is possible to make the number of latch circuits for holding write data included in a sense amplifier unit SAU smaller than the number of bits of data to be written. Therefore, it is possible to simplify the circuit and to suppress an increase in a chip area.

2. Second Embodiment

Next, a second embodiment will be described. The second embodiment is different from the first embodiment in that a bit line BL having a precharge voltage applied thereto is determined from arithmetic operation results of pieces of data which are held in latch circuits ADL, BDL, and CDL in a verification operation. Hereinafter, only differences from the first embodiment will be described.

2.1 Data Held in Latch Circuit SDL in Verification Operation

First, data held in a latch circuit SDL during a verification operation will be described with reference to FIG. 19.

As shown in the drawing, arithmetic operation results of pieces of data that are held in latch circuits ADL, BDL, and CDL are stored in the latch circuit SDL. That is, results corresponding to data of a middle-order bit which is stored in the latch circuit BLD, data of a high-order bit which is stored in the latch circuit CDL, and inverted data of programming data which is stored in the latch circuit ADL are stored in the latch circuit SDL.

More specifically, in a verification operation with respect to an "A" level, data of a logical arithmetic expression; SDL=/((/ADL)×BDL×(/CDL)) is stored in the latch circuit SDL. In a first verification operation with respect to an "A" level, data of '0' is stored in all latch circuits ADL corresponding to an "A" level. Accordingly, data of '0' is stored in all latch circuits SDL corresponding to an "A" level. In addition, in a second verification operation and the subsequent verification operations with respect to an "A" level, data of '0' is stored in a latch circuit ADL of a sense amplifier unit SAU that fails in the previous verification operation, and data of '1' is stored in a latch circuit ADL of a sense amplifier unit SAU that passes the verification operation. Accordingly, data of '0' is stored in a latch circuit SDL of the sense amplifier unit SAU that fails in the previous verification operation, and data of '1' is stored in a latch circuit SDL of a sense amplifier unit SAU that passes the verification operation. In addition, in a verification operation with respect to an "A" level, data of '1' is stored in latch circuits SDL corresponding to "Er", "B" to "E", and "G" levels, and data of '0' is stored in a latch circuit SDL corresponding to an "F" level.

In a verification operation with respect to a "B" level, data of a logical arithmetic expression; SDL=/((/ADL)×(/BDL)×CDL) is stored in a latch circuit SDL. Accordingly, in a first verification operation with respect to a "B" level, data of '0' is stored in all latch circuits SDL corresponding to a "B" level. In addition, in a second verification operation and the subsequent verification operations with respect to a "B" level, data of '0' is stored in a latch circuit SDL of a sense amplifier unit SAU that fails in the previous verification operation, and data of '1' is stored in a latch circuit SDL of a sense amplifier unit SAU that passes the verification operation. In addition, in a verification operation with respect to a "B" level, data of '1' is stored in latch circuits SDL corresponding to "Er", "A", "C", "D", "F", and "G" levels, and data of '0' is stored in a latch circuit SDL corresponding to an "E" level.

In a verification operation with respect to a "C" level, data of a logical arithmetic expression; SDL=/((/ADL)×(/BDL)× (/CDL)) is stored in a latch circuit SDL. Accordingly, in a first verification operation with respect to a "C" level, data of '0' is stored in all latch circuits SDL corresponding to a "C" level. In addition, in a second verification operation and the subsequent verification operations with respect to a "C" level, data of '0' is stored in a latch circuit SDL of a sense amplifier unit SAU that fails in the previous verification operation, and data of '1' is stored in a latch circuit SDL of a sense amplifier unit SAU that passes the verification operation. In addition, in a verification operation with respect to a "C" level, data of '1' is stored in latch circuits SDL corresponding to "Er" to "B" and "E" to "G" levels, and data of '0' is stored in a latch circuit SDL corresponding to a "D" level.

In a verification operation with respect to a "D" level, data of a logical arithmetic expression; SDL=/((/ADL)×(/BDL)×(/CDL)) which is the same as that of the "C" level is stored in a latch circuit SDL. Accordingly, in a first verification operation with respect to a "D" level, data of '0' is stored in all latch circuits SDL corresponding to a "D" level. In addition, in a second verification operation and the subsequent verification operations with respect to a "D" level, data of '0' is stored in a latch circuit SDL of a sense amplifier unit SAU that fails in the previous verification operation, and data of '1' is stored in a latch circuit SDL of a sense amplifier unit SAU that passes the verification operation. In addition, in a verification operation with respect to a "D" level, data of '1' is stored in latch circuits SDL corresponding to "Er" to "C" and "E" to "G" levels. More specifically, regarding "C" and "D" levels, pieces of data having the same value are stored in latch circuits BDL and CDL, but data of '1' is stored in a latch circuit ADL corresponding to a "C" level in a verification operation with respect to a "D" level. For this reason, data of '1' is stored in a latch circuit SDL corresponding to a "C" level.

In a verification operation with respect to an "E" level, data of a logical arithmetic expression; SDL=/((/ADL)×(/BDL)×CDL) which is the same as that of the "B" level is stored in a latch circuit SDL. Accordingly, in a first verification operation with respect to an "E" level, data of '0' is stored in all latch circuits SDL corresponding to an "E" level. In addition, in a second verification operation and the subsequent verification operations with respect to an "E" level, data of '0' is stored in a latch circuit SDL of a sense amplifier unit SAU that fails in the previous verification operation, and data of '1' is stored in a latch circuit SDL of a sense amplifier unit SAU that passes the verification operation. In addition, in a verification operation with respect to an "E" level, data of '1' is stored in latch circuits SDL corresponding to "Er" to "D", "F", and "G" levels.

In a verification operation with respect to an "F" level, data of a logical arithmetic expression; SDL=/((/ADL)×BDL×(/CDL)) which is the same as that of the "A" level is stored in a latch circuit SDL. Accordingly, in a first verification operation with respect to an "F" level, data of '0' is stored in all latch circuits SDL corresponding to an "F" level. In addition, in a second verification operation and the subsequent verification operations with respect to an "F" level, data of '0' is stored in a latch circuit SDL of a sense amplifier unit SAU that fails in the previous verification operation, and data of '1' is stored in a latch circuit SDL of a sense amplifier unit SAU that passes the verification operation. In addition, in a verification operation with respect to an "F" level, data of '1' is stored in latch circuits SDL corresponding to "Er" to "E" and "G" levels.

In a verification operation with respect to a "G" level, data of a logical arithmetic expression; SDL=/((/ADL)×BDL×CDL) is stored in a latch circuit SDL. Accordingly, in a first verification operation with respect to a "G" level, data of '0' is stored in all latch circuits SDL corresponding to a "G" level. In addition, in a second verification operation and the subsequent verification operations with respect to a "G" level, data of '0' is stored in a latch circuit SDL of a sense amplifier unit SAU that fails in the previous verification operation, and data of '1' is stored in a latch circuit SDL of a sense amplifier unit SAU that passes the verification operation. In addition, in a verification operation with respect to a "G" level, data of '1' is stored in latch circuits SDL corresponding to "Er" to "F" levels.

2.2 Specific Example of Writing Operation

A writing operation of this embodiment will be described more specifically. A combination of a programming operation and a verification operation in this embodiment is the same as those in FIGS. 13 and 14 of the first embodiment.

Figure 20:
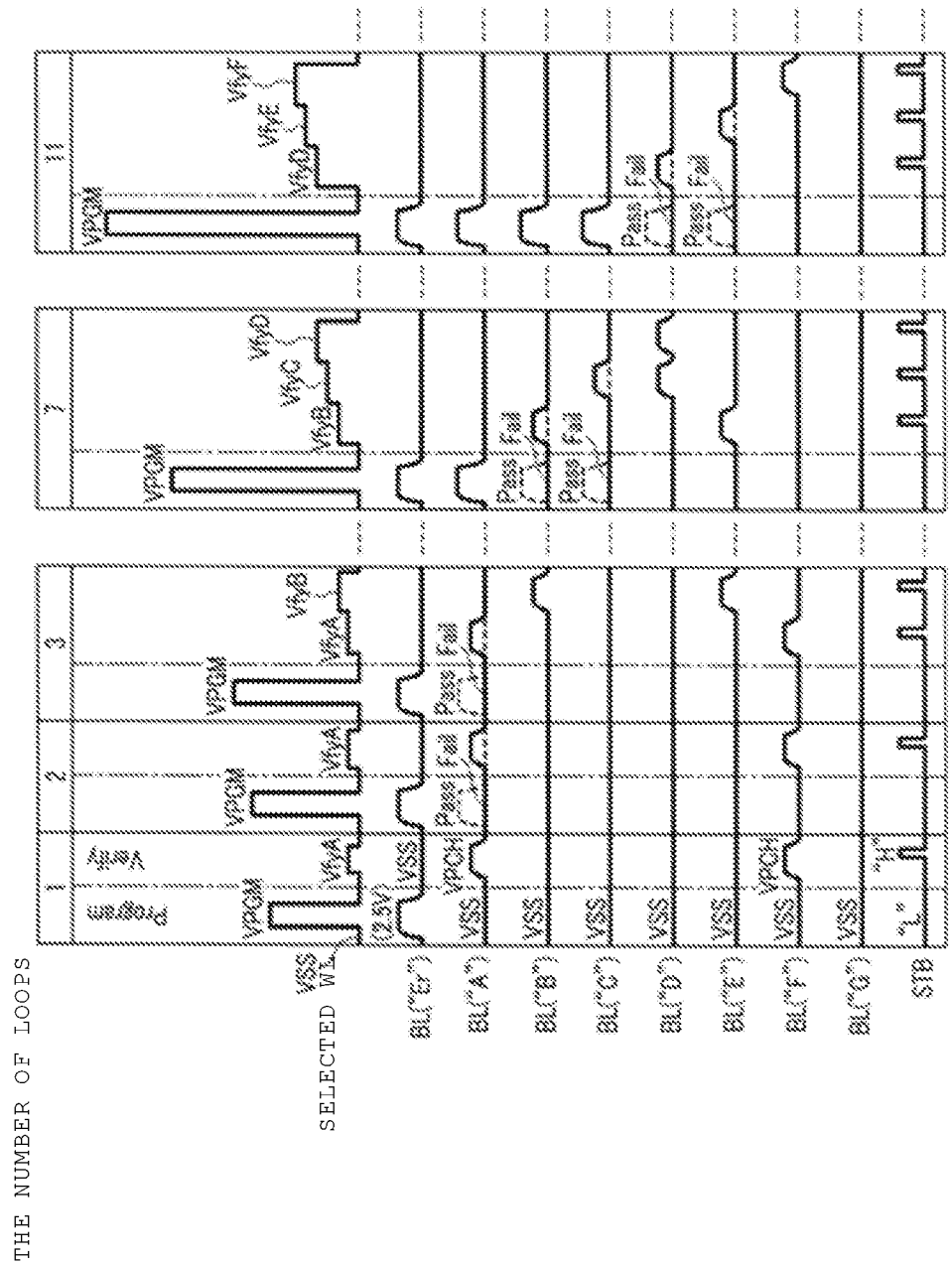
FIG. 20 is a timing chart showing voltages of a selected word line, bit lines, and a signal STB in a writing operation of the semiconductor memory device according to the second embodiment.

FIG. 20 shows the state of a potential of each wiring in this embodiment. FIG. 20 shows changes over time in a potential of a selected word line WL, potentials of bit lines BL ("Er") to BL ("G"), and a potential of a signal STB in a sense amplifier unit SAU in first to third, seventh, and eleventh loops.

As shown in the drawing, a programming operation and a verification operation in the first loop are the same as those in FIG. 15 of the first embodiment.

In the second loop, a programming of '0' operation is performed on the bit line BL ("A") and the bit lines BL ("B") to BL ("G") that fail in a first verification operation with respect to an "A" level. Next, the verification operation with respect to an "A" level is executed. At this time, a precharge voltage VPCH (for example, 0.5 V) is applied to the bit line BL ("A") and the bit line BL ("F") that fail in the verification operation with respect to an "A" level of the first loop.

Similarly to the second loop, in the third loop, programming of '0' is performed on the bit line BL ("A") and the bit lines BL ("B") to BL ("G") that fail in the verification operation with respect to an "A" level. Next, similarly to the second loop, first, a verification operation with respect to an "A" level is executed. At this time, a precharge voltage VPCH (for example, 0.5 V) is applied to the bit line BL ("A") and the bit line BL ("F") that fail in the verification operation with respect to an "A" level in the second loop. Next, a verification operation with respect to a "B" level is executed. At this time, a precharge voltage VPCH (for example, 0.5 V) is applied to the bit lines BL ("B") and BL ("E").

The same process is repeated, and programming of '0' is performed on the bit lines BL ("B") and BL ("C") and the bit lines BL ("D") to BL ("G") that fail in verification, in the seventh loop. Next, verification operations with respect to ("B") to ("D") levels are sequentially performed. In the verification operation with respect to a "B" level, a precharge voltage VPCH (for example, 0.5 V) is applied to the bit line BL ("B") and the bit line BL ("E") that fail in the verification operation with respect to a "B" level in the sixth loop. In the verification operation with respect to a "C" level, a precharge voltage VPCH (for example, 0.5 V) is applied to the bit lines BL ("C") and BL ("D") that fail in the verification operation with respect to a "C" level in the sixth loop. In the verification operation with respect to a "D" level, a precharge voltage VPCH (for example, 0.5 V) is applied to the bit line BL ("D").

In addition, in the eleventh loop, programming of '0' is performed on the bit lines BL ("D") and BL ("E") and the bit lines BL ("F") and BL ("G") that fail in verification. Next, verification operations with respect to ("D") to ("F") levels are performed. In the verification operation with respect to a "D" level, a precharge voltage VPCH (for example, 0.5 V) is applied to the bit line BL ("D") that fails in the verification operation with respect to a "D" level in the tenth loop. In the verification operation with respect to an "E" level, a precharge voltage VPCH (for example, 0.5 V) is applied to the bit line BL ("E") that fails in the verification operation with respect to an "E" level in the tenth loop. In the verification operation with respect to an "F" level, a precharge voltage VPCH (for example, 0.5 V) is applied to the bit line BL ("F").

As described above, for example, focusing on the bit lines BL ("A") and BL ("F"), a precharge voltage VPCH is applied to the bit line BL ("A") in the first to sixth loops in which a verification operation with respect to an "A" level is performed. However, in the second to sixth loops, a precharge voltage VPCH is applied to the bit line BL ("A") that fails in the previous verification operation with respect to an "A" level.

A precharge voltage VPCH is applied to the bit line ("F") in the first to sixth loops in which a verification operation with respect to an "A" level is performed and in eleventh to sixteenth loops in which a verification operation with respect to an "F" level is performed. However, in twelfth to sixteenth loops, a precharge voltage VPCH is applied to the bit line BL ("F") that fails in the previous verification operation with respect to an "F" level.

2.3 Effects According to This Embodiment

In the configuration according to this embodiment, it is possible to obtain the same effects as those in the first embodiment.

Further, in the configuration according to this embodiment, with regard to a bit line BL that passes a verification operation, a precharge voltage is not applied to the bit line BL in the next verification operation and the subsequent verification operations. Therefore, it is possible to reduce the power consumption of the semiconductor memory device.

3. Modification Example and the Like

The semiconductor memory device according to the above-described embodiment includes a first memory cell (MT in FIG. 2) which is capable of being set to any of at least four threshold voltages, a first bit line (BL ("A") in FIG. 15) which is connected to the first memory cell, a word line (selected WL in FIG. 15) which is connected to a gate of the first memory cell, and a first sense amplifier (SAU in FIG. 5) which is connected to the first bit line. After a programming operation of writing data in the first memory cell is performed, a verification operation of verifying the threshold voltage of the first memory cell is performed. In a first verification operation (first loop in FIG. 15) in which a first voltage (VfyA in FIG. 15) is applied to the word line, a first sense amplifier applies a charging voltage (VPCH in FIG. 15) to the first bit line. In a second verification operation ("B" verification in a third loop in FIG. 15) in which a second voltage (VfyB in FIG. 15) higher than the first voltage is applied to the word line, the first sense amplifier does not apply the charging voltage to the first bit line. In a third verification operation ("F" verification in an eleventh loop in FIG. 15) in which a third voltage (VfyF in FIG. 15) higher than the second voltage is applied to the word line, the first sense amplifier applies the charging voltage to the first bit line.

It is possible to provide the semiconductor memory device capable of improving processing capability by applying the above-described embodiment. Meanwhile, the embodiment is not limited to the above-described mode, and various modifications can be made thereto.

For example, in the above-described embodiment, a voltage sensing type sense amplifier may be used.

Further, in the above-described embodiment, an AND operation and an OR operation that use a sense amplifier section SA are described, but the control of a transistor during an arithmetic operation is not limited to that described above. For example, the taking-up of pieces of data from latch circuits BDL and CDL to a bus LBUS in steps 1 and 3 of FIG. 7 may be simultaneously performed.

Further, the exemplary embodiment can also be applied to a three-dimensional stacked NAND-type flash memory or a flat type or a flat NAND-type flash memory which is different from that in the above-described embodiment. Further, the exemplary embodiment can also be applied to a semiconductor memory device using a storage element capable of holding data of four values (2 bits) or more without being limited to the NAND-type flash memory.

Further, the term "connection" in the above-described embodiment also includes a state where indirect connection is made through anything else such as a transistor or a resistor.

Meanwhile, the embodiments related to the exemplary embodiment may be implemented as follows. For example, when a memory cell transistor MT can hold data of 2 bits (four values) and threshold value levels at the time of holding any of the four values are set to be an E level (erasure level), an A level, a B level, and a C level in ascending order, (1) a voltage applied to a word line selected for a read-out operation of an A level is in a range of, for example, 0 V to 0.55 V in a read-out operation. The exemplary embodiment is not limited thereto, and the voltage may be in any of ranges of 0.1 V to 0.24 V, 0.21 V to 0.31 V, 0.31 V to 0.4 V, 0.4 V to 0.5 V, and 0.5 V to 0.55 V.

A voltage applied to a word line selected for a read-out operation of a B level is in a range of, for example, 1.5 V to 2.3 V. The exemplary embodiment is not limited thereto, and the voltage may be in any of ranges of 1.65 V to 1.8 V, 1.8 V to 1.95 V, 1.95 V to 2.1 V, and 2.1 V to 2.3 V.

A voltage applied to a word line selected for a read-out operation of a C level is in a range of, for example, 3.0 V to 4.0 V. The exemplary embodiment is not limited thereto, and the voltage may be in any of ranges of 3.0 V to 3.2 V, 3.2 V to 3.4 V, 3.4 V to 3.5 V, 3.5 V to 3.6 V, and 3.6 V to 4.0 V.

A time (tR) of the read-out operation may be in a range of, for example, 25 μs to 38 μs, 38 μs to 70 μs, or 70 μs to 80 μs.

(2) A writing operation includes a programming operation and a verification operation as described above. In the writing operation, a voltage which is first applied to a word line selected during a programming operation is in a range of, for example, 13.7 V to 14.3 V. The exemplary embodiment is not limited thereto, and the voltage may be in any of ranges of, for example, 13.7 V to 14.0 V and 14.0 V to 14.6 V.

A voltage which is first applied to a selected word line at the time of writing an odd-numbered word line and a voltage which is first applied to a selected word line at the time of writing an even-numbered word line may be changed.

When a programming operation is set to be an incremental step pulse program (ISPP) method, for example, approximately 0.5 V is adopted as a step-up voltage.

A voltage applied to a non-selected word line may be in a range of, for example, 6.0 V to 7.3 V. The exemplary embodiment is not limited thereto, and the voltage may be in a range of, for example, 7.3 V to 8.4 V or may be equal to or less than 6.0 V.

A path voltage to be applied may be changed according to whether a non-selected word line is an odd-numbered word line or an even-numbered word line.

A time (tProg) of the writing operation may be in any of ranges of, for example, 1700 μs to 1800 μs, 1800 μs to 1900 μs, and 1900 μs to 2000 μs.

(3) In an erasure operation, a voltage which is first applied to a well which is disposed on a semiconductor substrate and has the above-mentioned memory cells disposed thereon is in a range of, for example, 12 V to 13.6 V. The exemplary embodiment is not limited thereto, and the voltage may be in a range of, for example, 13.6 V to 14.8 V, 14.8 V to 19.0 V, 19.0 to 19.8 V, or 19.8 V to 21 V.

A time (tErase) of the erasure operation may be in a range of, for example, 3000 μs to 4000 μs, 4000 μs to 5000 μs, or 4000 μs to 9000 μs.

(4) A structure of a memory cell includes a charge storage layer which is disposed on a semiconductor substrate (silicon substrate) through a tunnel insulating film having a film thickness of 4 nm to 10 nm. The charge storage layer can be configured to have a structure in which an insulating film such as SiN having a film thickness of 2 nm to 3 nm or SiON, and a polysilicon film having a film thickness of 3 nm to 8 nm are stacked. In addition, a metal such as Ru may be added to the polysilicon film. An insulating film is provided on the charge storage layer. The insulating film includes a silicon oxide film having a film thickness of 4 nm to 10 nm which is interposed between a lower High-k film having a film thickness of 3 nm to 10 nm and an upper High-k film having a film thickness of 3 nm to 10 nm. Examples of a material of the High-k film include HfO and the like. In addition, the film thickness of the silicon oxide film can be larger than the film thickness of the High-k film. A control electrode having a film thickness of 30 nm to 70 nm is provided on the insulating film through a material having a film thickness of 3 nm to 10 nm. Here, such material is a metal oxide film such as TaO or a metal nitride film such as TaN. In addition, W or the like can be used for the control electrode.

In addition, an air gap can be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell which is capable of being set to any one of at least eight threshold voltages;
   a first bit line electrically connected to the first memory cell;
   a sense amplifier connected to the first bit line, wherein the sense amplifier has at least four data latch circuits;
   an extra data latch circuit electrically connected to the sense amplifier through a bus; and
   a controller configured to control a write operation that includes a programming operation for changing the threshold voltage of the first memory cell and a verification operation for verifying the threshold voltage of the first memory cell, wherein the controller is configured to cause, in the programming operation, the extra data latch circuit and at least one of the four data latch circuits to be accessed, and
   wherein the controller is configured to cause, in the verification operation, the four data latch circuits, but not the extra latch circuit, to be accessed.

2. The device according to claim 1, wherein the verification operation includes seven verification operations, the device further comprising:
   a word line connected to a gate of the first memory cell, wherein
   the seven verification operations include first, second, third, fourth, fifth, sixth, and seventh verification operations, and
   during the first through seventh verification operations, respective first through seventh verification voltages, which are different from each other, are applied to the word line.

3. The device according to claim 2, wherein the sense amplifier:
   applies a charging voltage to the first bit line during two of the seven verification operations, and
   does not apply the charging voltage to the first bit line during the remaining five of the seven verification operations.

4. The device according to claim 3, further comprising:
   a second memory cell that is capable of being set to any one of at least eight threshold voltages, and which has a gate connected to the word line; and
   a second bit line connected to the second memory cell,
   wherein the sense amplifier applies the charging voltage to the second bit line during two of the remaining five verification operations, and does not apply the charging voltage to the second bit line during the verification operations other than the two of the remaining five verification operations.

5. The device according to claim 4, further comprising:
   a third memory cell that is capable of being set to any one of the at least eight threshold voltages, and which has a gate connected to the word line; and
   a third bit line connected to the third memory cell,
   wherein the sense amplifier applies the charging voltage to the third bit line during a different two of the remaining five verification operations, and does not apply the charging voltage to the third bit line during the verification operations other than the different two of the remaining five verification operations.

6. The device according to claim 5, further comprising:
   a fourth memory cell that is capable of being set to any one of the at least eight threshold voltages, and which has a gate connected to the word line; and
   a fourth bit line connected to the fourth memory cell,
   wherein the sense amplifier applies the charging voltage to the fourth bit line during one of the seven verification operations other than said two of the seven verification operations, said two of the remaining five verification operations, and said different two of the remaining five verification operations, and does not apply the charging voltage to the fourth bit line during said two of the seven verification operations, said two of the remaining five verification operations, and said different two of the remaining five verification operations.

7. The device according to claim 2, wherein the seven verification operations respectively correspond to seven of the at least eight threshold voltages.

8. The device according to claim 2,
wherein the first verification operation corresponds to the programming operation for writing first data in the first memory cell,
wherein the second verification operation corresponds to the programming operation for writing second data different from the first data in the first memory cell,
wherein the third verification operation corresponds to the programming operation for writing third data different from the first and second data in the first memory cell,
wherein the fourth verification operation corresponds to the programming operation for writing fourth data different from the first to third data in the first memory cell,
wherein the fifth verification operation corresponds to the programming operation for writing fifth data different from the first to fourth data in the first memory cell,
wherein the sixth verification operation corresponds to the programming operation for writing sixth data different from the first to fifth data in the first memory cell, and
wherein the seventh verification operation corresponds to the programming operation for writing seventh data different from the first to sixth data in the first memory cell.

9. The device according to claim 8, wherein
the programming operation is carried out in a plurality of loops, and
the first through seventh verification operations are each carried out following a corresponding one of the programming operations.

10. The device according to claim 9, wherein a programming voltage is increased in each subsequent loop.

11. A semiconductor memory device comprising:
a first memory cell which is capable of being set to any one of at least eight threshold voltages;
a first bit line electrically connected to the first memory cell;
a sense amplifier connected to the first bit line, wherein the sense amplifier has at least four data latch circuits;
an extra data latch circuit electrically connected to the sense amplifier through a bus; and
a controller configured to control a write operation that includes a programming operation for changing the threshold voltage of the first memory cell and a verification operation for verifying the threshold voltage of the first memory cell,
wherein the controller is configured to cause, in the programming operation, the extra data latch circuit and at least one of the four data latch circuits to be accessed,
wherein the controller is configured to cause, in the verification operation on the first memory cell, the four data latch circuits, but not the extra data latch circuit, to be accessed.

12. The device according to claim 11, wherein the verification operation includes seven verification operations, the device further comprising:
a word line connected to a gate of the first memory cell, wherein the seven verification operations include:
a first verification operation in which a first voltage is applied to the word line,
a second verification operation in which a second voltage higher than the first voltage is applied to the word line,
a third verification operation in which a third voltage higher than the second voltage is applied to the word line,
a fourth verification operation in which a fourth voltage higher than the third voltage is applied to the word line,
a fifth verification operation in which a fifth voltage higher than the fourth voltage is applied to the word line,
a sixth verification operation in which a sixth voltage higher than the fifth voltage is applied to the word line, and
a seventh verification operation in which a seventh voltage higher than the sixth voltage is applied to the word line, and
wherein the sense amplifier
applies a charging voltage to the first bit line during two of the seven verification operations, and
does not apply the charging voltage to the first bit line during the remaining five of the seven verification operations.

13. The device according to claim 12, further comprising:
a second memory cell that is capable of being set to any one of the at least eight threshold voltages, and which has a gate connected to the word line; and
a second bit line connected to the second memory cell,
wherein the sense amplifier applies the charging voltage to the second bit line during two of the remaining five verification operations, and does not apply the charging voltage to the second bit line during the verification operations other than the two of the remaining five verification operations.

14. The device according to claim 13, further comprising:
a third memory cell that is capable of being set to any one of the at least eight threshold voltages, and which has a gate connected to the word line; and
a third bit line connected to the third memory cell,
wherein the sense amplifier applies the charging voltage to the third bit line during a different two of the remaining five verification operations, and does not apply the charging voltage to the third bit line during the verification operations other than the different two of the remaining five verification operations.

15. The device according to claim 14, further comprising:
a fourth memory cell that is capable of being set to any one of the at least eight threshold voltages, and which has a gate connected to the word line; and
a fourth bit line connected to the fourth memory cell,
wherein the sense amplifier applies the charging voltage to the fourth bit line during one of the seven verification operations other than said two of the seven verification operations, said two of the remaining five verification operations, and said different two of the remaining five verification operations, and does not apply the charging voltage to the fourth bit line during said two of the seven verification operations, said two of the remaining five verification operations, and said different two of the remaining five verification operations.

16. The device according to claim 11, wherein the seven verification operations respectively correspond to seven of the at least eight threshold voltages.

17. The device according to claim 11,
wherein the first verification operation corresponds to the programming operation for writing first data in the first memory cell,
wherein the second verification operation corresponds to the programming operation for writing second data different from the first data in the first memory cell,
wherein the third verification operation corresponds to the programming operation for writing third data different from the first and second data in the first memory cell,
wherein the fourth verification operation corresponds to the programming operation for writing fourth data different from the first to third data in the first memory cell,
wherein the fifth verification operation corresponds to the programming operation for writing fifth data different from the first to fourth data in the first memory cell,
wherein the sixth verification operation corresponds to the programming operation for writing sixth data different from the first to fifth data in the first memory cell, and
wherein the seventh verification operation corresponds to the programming operation for writing seventh data different from the first to sixth data in the first memory cell.

18. The device according to claim 17, wherein
the programming operation is carried out in a plurality of loops, and
the first to seventh verification operations are each carried out following a corresponding one of the programming operations.

19. The device according to claim 18, wherein a programming voltage is increased in each subsequent loop.

20. The device according to claim 19,
wherein said at least four data latch circuits of the sense amplifier includes a first latch circuit and a second latch circuit,
wherein the extra data latch circuit is a third latch circuit that is connected to the sense amplifier via a switching element, and
wherein, during the programming operation,
the first latch circuit stores a first bit as first information,
the second latch circuit stores a second bit as second information,
the third latch circuit stores a third bit as third information, and
the sense amplifier applies the charging voltage to the first bit line based on the first information and second information, and not on the third information.

\* \* \* \* \*